United States Patent
Sun et al.

(10) Patent No.: US 12,464,788 B2
(45) Date of Patent: Nov. 4, 2025

(54) METHOD FOR DEPOSITING NANOSTRUCTURES ON SUBSTRATE AND NANOSTRUCTURE ARRAYS

(71) Applicant: PEKING UNIVERSITY, Beijing (CN)

(72) Inventors: Wei Sun, Beijing (CN); Yahong Chen, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 577 days.

(21) Appl. No.: 17/916,052

(22) PCT Filed: Mar. 30, 2021

(86) PCT No.: PCT/CN2021/083941
§ 371 (c)(1),
(2) Date: Sep. 30, 2022

(87) PCT Pub. No.: WO2021/197322
PCT Pub. Date: Oct. 7, 2021

(65) Prior Publication Data
US 2023/0141367 A1     May 11, 2023

(30) Foreign Application Priority Data

Mar. 31, 2020 (WO) ................ PCT/CN2020/082375
Mar. 31, 2020 (WO) ................ PCT/CN2020/082377
(Continued)

(51) Int. Cl.
*H10D 62/10*     (2025.01)
*B82Y 5/00*     (2011.01)
(Continued)

(52) U.S. Cl.
CPC ........... *H10D 62/119* (2025.01); *G03F 7/162* (2013.01); *H10D 30/014* (2025.01); *H10D 30/43* (2025.01);
(Continued)

(58) Field of Classification Search
CPC .... H10D 62/119; H10D 30/014; H10D 30/43; G03F 7/162; H10K 10/464;
(Continued)

(56) References Cited

U.S. PATENT DOCUMENTS 6,969,690 B2 * 11/2005 Zhou ..................... B82Y 10/00
 438/678
9,859,500 B2 * 1/2018 Afzali-Ardakani .... H10K 71/15
(Continued)

FOREIGN PATENT DOCUMENTS

CN     105793956 A     7/2016
KR     20070112733 A     11/2007

OTHER PUBLICATIONS

International Search Report of PCT/CN2021/083941, mailed on Jun. 28, 2021.
(Continued)

*Primary Examiner* — Caleen O Sullivan
(74) *Attorney, Agent, or Firm* — Junhe Law Office P.C.; Zhaohui Wang

(57) ABSTRACT

A method for depositing nanostructures on a substrate comprises: forming a patterned alignment layer on a surface of the substrate, wherein the patterned alignment layer has one or more cavities each having a main region for accommodating at least one template nanostructure therein and a plurality of extension regions extending from the main region and in fluid communication with the main region, and wherein the plurality of extension regions are sized and shaped to not accommodate the at least one template nanostructure; and diffusing template nanostructures into the one or more cavities of the patterned alignment layer.

22 Claims, 23 Drawing Sheets

(30) Foreign Application Priority Data

Apr. 1, 2020 (WO) ............... PCT/CN2020/082777
Apr. 1, 2020 (WO) ............... PCT/CN2020/082778

(51) Int. Cl.
　　*B82Y 40/00*　　(2011.01)
　　*G03F 7/16*　　(2006.01)
　　*H10D 30/01*　　(2025.01)
　　*H10D 30/43*　　(2025.01)
　　*H10K 10/46*　　(2023.01)
　　*H10K 71/12*　　(2023.01)
　　*H10K 85/20*　　(2023.01)

(52) U.S. Cl.
　　CPC ......... *H10K 10/464* (2023.02); *H10K 10/484* (2023.02); *H10K 71/12* (2023.02); *H10K 85/221* (2023.02); *B82Y 5/00* (2013.01); *B82Y 40/00* (2013.01)

(58) Field of Classification Search
　　CPC .... H10K 10/484; H10K 71/12; H10K 85/221; H10K 71/191; H10K 10/491; B82Y 5/00; B82Y 40/00; B82Y 10/00; B82Y 15/00
　　USPC ......................................................... 430/22
　　See application file for complete search history.

(56) References Cited

U.S. PATENT DOCUMENTS

| | | | |
|---|---|---|---|
| 10,099,920 B2 | 10/2018 | Shen et al. | |
| 2010/0239488 A1 | 9/2010 | Zettl et al. | |
| 2016/0299274 A1* | 10/2016 | Qin | .......................... G02B 1/14 |
| 2018/0348629 A1 | 12/2018 | Liu et al. | |

OTHER PUBLICATIONS

The International Technology Roadmap for Semiconductors: 2013.
G. Hills et al., Understanding energy efficiency benefits of carbon nanotube field-effect transistors for digital VLSI, IEEE Trans. Nanotech. 17, 1259-1269 (2018).
Q. Cao et al., Arrays of single-walled carbon nanotubes with full surface overage for high-performance electronics, Nature Nanotech. 8, 180-186 (2013).
G. J. Brady, K. R. Jinkins, M. S. Arnold, Channel length scaling behavior in transistors based on individual versus dense arrays of carbon nanotubes, J. Appl. Phys. 122, 124506 (2017).
G. J. Brady et al., Quasi-ballistic carbon nanotube array transistors with current density exceeding Si and GaAs, Sci. Adv. 2, e1601240 (2016).
Q. Cao, J. Tersoff, D. B. Farmer, Y. Zhu, S.-J. Han, Carbon nanotube transistors scaled to a 40-nanometer footprint, Science 356, 1369-1372 (2017).
H. A. Becerril, A.T.Woolley, DNA-templated nanofabrication, Chem. Soc. Rev. 38, 329-337 (2009).
M. R. Jones, N. C. Seeman, C. A. Mirkin, Programmable materials and the nature of the DNA bond, Science 347, 1260901 (2015).
S.-P. Han, H. T. Maune, R. D. Barish, M. Bockrath, W. A. Goddard, III, DNA-linker-induced surface assembly of ultra dense parallel single walled carbon nanotube arrays, Nano Lett. 12, 1129-1135 (2012).
A. Mangalum, M. Rahman, M. L. Norton, Site-specific immobilization of single-walled carbon nanotubes onto single and one-dimensional DNA origami, J. Am. Chem. Soc. 135, 2451-2454 (2013).
H. Pei et al., Organizing end-site-specific SWCNTs in specific loci using DNA, J. Am. Chem. Soc. 141, 11923-11928 (2019).
W. Sun et al., Precise pitch-scaling of carbon nanotube arrays within three-dimensional DNA nanotrenches, Science 368, 874-877 (2020).

H. T. Maune et al., Self-assembly of carbon nanotubes into two-dimensional geometries using DNA origami templates, Nature Nanotech. 5, 61-66 (2010).
K. Keren, R. S. Berman, E. Buchstab, U. Sivan, E. Braun, DNA-templated carbon nanotube field-effect transistor, Science 302, 1380-1382 (2003).
S.-J. Han et al., High-speed logic integrated circuits with solution-processed self-assembled carbon nanotubes, Nature Nanotech. 12, 861-865 (2017).
D. Zhong et al., Gigahertz integrated circuits based on carbon nanotube films, Nature Electron. 1, 40-45 (2018).
C. Zhao et al., Exploring the performance limit of carbon nanotube network film field-effect transistors for digital integrated circuit applications, Adv. Funct. Mater. 29, 1808574 (2019).
Liu et al., Carbon nanotube complementary gigahertz integrated circuits and their applications on wireless sensor interface systems, ACS Nano 13, 2526-2535 (2019).
A. M. Hung et al., Large-area spatially ordered arrays of gold nanoparticles directed by lithographically confined DNA origami, Nature Nanotech. 5, 121-126 (2010).
N. Nakatsuka et al., Aptamer-field-effect transistors overcome Debye length limitations for small-molecule sensing, Science 362, 319-324 (2018).
F. Zhou et al., Programmably shaped carbon nanostructure from shape-conserving carbonization of DNA, ACS Nano 10, 3069-3077 (2016).
Q. Cao, S.-J. Han, G. S. Tulevski, Fringing-field dielectrophoretic assembly of ultrahigh-density semiconducting nanotube arrays with a self-limited pitch, Nature Commun. 5, 5071 (2014).
J. Wu et al., Self-assembly of semiconducting single-walled carbon nanotubes into dense, aligned rafts, Small 9, 4142-4148 (2013).
Y. Cao et al., Radio frequency transistors using aligned semiconducting carbon nanotubes with current-gain cutoff frequency and maximum oscillation frequency simultaneously greater than 70 GHz, ACS Nano 10, 6782-6790 (2016).
J. Wu, A. Antaris, M. Gong, H. Dai, Top-down patterning and self-assembly for regular arrays of semiconducting single-walled carbon nanotubes, Adv. Mater. 26, 6151-6156 (2014).
D. Lee et al., Three-dimensional fin-structured semiconducting carbon nanotube network transistor, ACS Nano 10, 10894-10900 (2016).
M. M. Shulaker et al., High-performance carbon nanotube field-effect transistors, IEEE Int. Electron Devices Meeting in San Francisco CA 33.6.1-33.6.4 (2014).
Y. Hu et al., Growth of high-density horizontally aligned SWNT arrays using Trojan catalysts, Nature Commun. 6, 6099 (2015).
L. Zhang et al., Assessment of chemically separated carbon nanotubes for nanoelectronics, J. Am. Chem. Soc. 130, 2686-2691 (2008).
L. Zhang et al., Optical characterizations and electronic devices of nearly pure (10,5) single-walled carbon nanotubes, J. Am. Chem. Soc. 131, 2454-2455 (2009).
A. Gopinath, P. W. K. Rothemund, Optimized assembly and covalent coupling of single-molecule DNA origami nanoarrays, ACS Nano 8, 12030-12040 (2014).
C. Qiu et al., Scaling carbon nanotube complementary transistors to 5-nm gate lengths, Science 355, 271-276 (2017).
L. Xiang et al., Low-power carbon nanotube-based integrated circuits that can be transferred to biological surfaces, Nature Electron. 1, 237-245 (2018).
C. Qiu et al., Dirac-source field-effect transistors as energy-efficient, high-performance electronic switches, Science 361, 387-392 (2018).
G. S. Tulevski et al., Toward high-performance digital logic technology with carbon nanotubes, ACS Nano 8, 8730-8745 (2014).
J. Zhang et al., Robust digital VLSI using carbon nanotubes, IEEE Transactions on Computer-Aided Design of Integrated Circuits and Systems 31, 453-471 (2012).
1First Office Action of Taiwanese Application No. 110111697, mailed on Jul. 30, 2024.

* cited by examiner

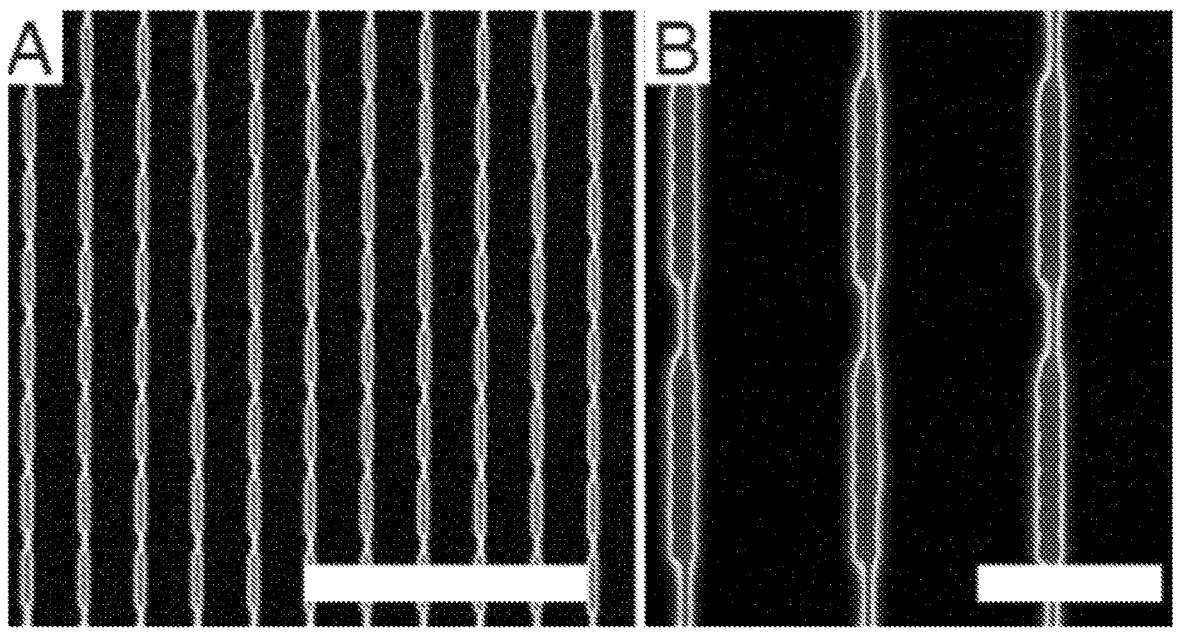
Figure 9A                    Figure 9B
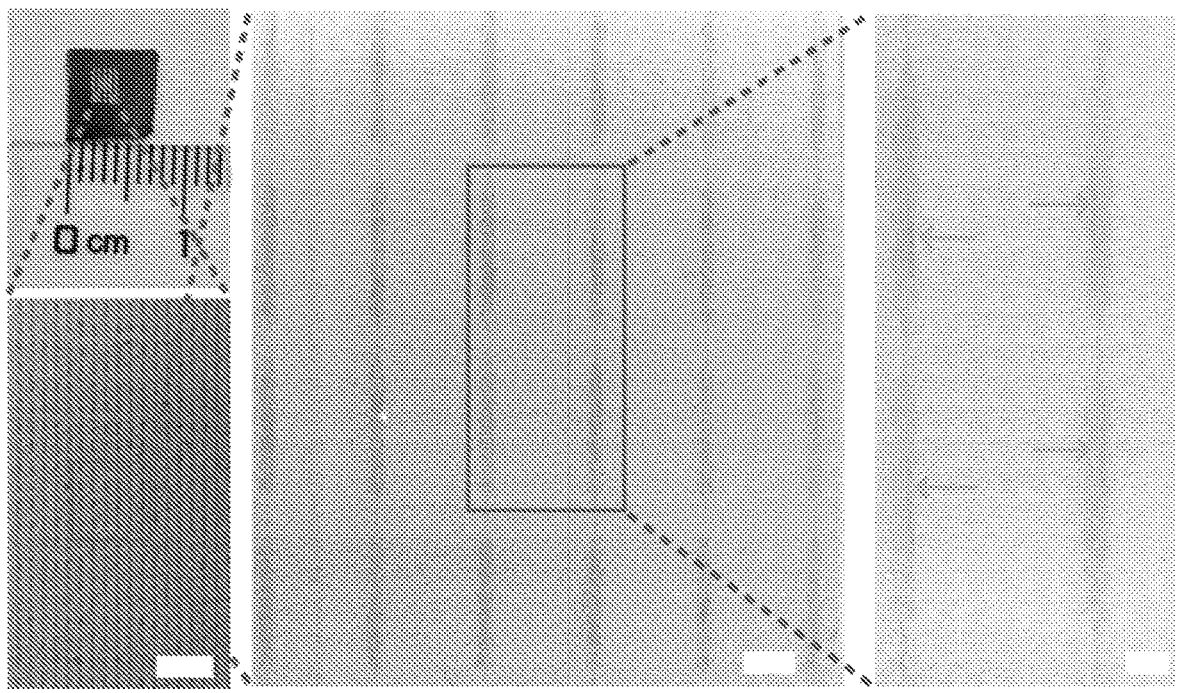
Figure 10

METHOD FOR DEPOSITING NANOSTRUCTURES ON SUBSTRATE AND NANOSTRUCTURE ARRAYS

CROSS REFERENCE TO RELATED APPLICATIONS

The present application claims priority to the PCT Application No. PCT/CN2020/082375 filed on Mar. 31, 2020, the PCT Application No. PCT/CN2020/082377 filed on Mar. 31, 2020, the PCT Application No. PCT/CN2020/082778 filed on Apr. 1, 2020, and the PCT Application No. PCT/CN2020/082777 filed on Apr. 1, 2020, the entire contents of which are incorporated herein by reference.

TECHNICAL FIELD

The application generally relates to nanofabrication technology, and more particularly, to a method for depositing nanostructures on a substrate and a nanostructure array manufactured by such method.

BACKGROUND

Artificial nucleic acid nanostructures and some other types of nanostructures can self-assemble into designated templates for spatially arranging functional materials in deep submicron-scale and nanoscale. The functional materials or nanostructures (e.g. carbon nanotubes (CNTs), metallic nanorods or nanoparticles, polymeric nanoparticles, and silicon nanowires), which may be bound to these templates, can be regularly and precisely positioned due to controllable assembling of the templates.

Various technologies have been developed to integrate the template nanostructures with conventional microfabrication technologies. For example, a patterned alignment layer may be formed on a substrate to facilitate and guide the placement of individual template nanostructures on the substrate. However, the yield and controllability for such methods are still unsatisfactory, reducing the prospect of utilizing them in industrial applications.

Thus, there is a need for further improvement to the existing nanofabrication technology.

SUMMARY

An objective of the present application is to provide a method for depositing nanostructures on a substrate.

According to an aspect of the present application, a method for depositing nanostructures on a substrate, comprising: forming a patterned alignment layer on a surface of the substrate, wherein the patterned alignment layer has one or more cavities each having a main region for accommodating at least one template nanostructure therein and a plurality of extension regions extending from the main region and in fluid communication with the main region, and wherein the plurality of extension regions are sized and shaped to not accommodate the at least one template nanostructure; and diffusing template nanostructures into the one or more cavities of the patterned alignment layer.

In some embodiments, the method further comprising: removing the patterned alignment layer from the substrate.

In some embodiments, removing the patterned alignment layer from the substrate comprises: removing the patterned alignment layer from the substrate using a liftoff process.

In some embodiments, the main region of each of the one or more cavities is further configured to orientate the at least one template nanostructure accommodated therein.

In some embodiments, each of the one or more cavities is further configured that, when the at least one template nanostructure is accommodated in the cavity, at least one translational degree of freedom of the at least one template nanostructure along the surface of the substrate is limited.

In some embodiments, forming a patterned alignment layer on a surface of the substrate comprises: forming an alignment layer on the surface of the substrate; and patterning the alignment layer.

In some embodiments, patterning the alignment layer comprises: patterning the alignment layer using a lithography process.

In some embodiments, the lithography process comprises: electro-beam lithography, photolithography, imprint lithography or directed self-assembly of block copolymers.

In some embodiments, forming an alignment layer on the surface of the substrate comprises: spin-coating the surface of the substrate with a photoresist to form the alignment layer.

In some embodiments, the photoresist comprises poly (methyl methacrylate) (PMMA) or polydimethylsiloxane (PDMS).

In some embodiments, diffusing template nanostructures into the one or more cavities of the patterned alignment layer comprises: dipping a solution containing the template nanostructures onto the patterned alignment layer; and incubating the substrate to diffuse the template nanostructures into the cavities.

In some embodiments, incubating the substrate comprises: dehydrating or evaporating the substrate in a sealed chamber for a predetermined time period.

In some embodiments, before diffusing template nanostructures into the one or more cavities of the patterned alignment layer, the method further comprises: differentiating the substrate to improve adhesivity of the surface of the substrate to the template nanostructures.

In some embodiments, the template nanostructures are decorated with functional nanostructures, and wherein, after removing the patterned alignment layer from the substrate, the method further comprises: removing template portion of the template nanostructures from the substrate to leave the functional nanostructures on the substrate.

In some embodiments, before removing template portion of the template nanostructures from the substrate, the method further comprises: forming fixation structures on the substrate to fix the functional nanostructures on the substrate.

In some embodiments, one of the one or more cavities has a plurality of extension regions which increase a volume of the cavity by at least 5%, or preferably by 10%, 20%, 30%, 50%, 100%, 150%, 200% or higher.

In some embodiments, each of the one or more cavities has a depth of 2 or more folds, preferably 5 or more folds, than a thickness of the template nanostructures.

In some embodiments, the template nanostructures comprise one or more substances selected from the group consisting of nucleic acid templates, decorated nucleic acid templates, protein templates, polymer templates, peptide nucleic acid templates, carbon nanotubes (CNTs), polymer-wrapped CNTs, CNT films, semiconductor nanoparticles, semiconductor nanowires, semiconductor nano-bricks, metal nanoparticles, metal nanowires, metal nano-bricks, polymeric nanoparticles, polymeric nanowires, polymeric nano-bricks, ceramic nanoparticles, ceramic nanowires, ceramic nano-bricks, metal oxide nanoparticles, metal oxide nanowires, metal oxide nano-bricks, fluoride nanoparticles, fluoride nanowires and fluoride nano-bricks.

In some embodiments, the template nanostructures are decorated with functional nanostructures.

In some embodiments, the functional nanostructures comprise one or more substances selected from the group consisting of carbon nanotubes (CNTs), polymer-wrapped CNTs, CNT films, semiconductor nanoparticles, semiconductor nanowires, semiconductor nano-bricks, metal nanoparticles, metal nanowires, metal nano-bricks, polymeric nanoparticles, polymeric nanowires, polymeric nano-bricks, ceramic nanoparticles, ceramic nanowires, ceramic nano-bricks, metal oxide nanoparticles, metal oxide nanowires, metal oxide nano-bricks, fluoride nanoparticles, fluoride nanowires and fluoride nano-bricks.

In another aspect of the present application, there is provided a nanostructure array comprising at least one template nanostructure on a substrate deposited by the method of the aforementioned aspect.

In yet another aspect of the present application, there is provided a nanostructure array comprising at least one functional nanostructure on a substrate deposited by the method of the aforementioned aspect.

The foregoing is an overview of the present application, which may simplify, summarize, and omit details. Those skilled in the art will appreciate that this section is merely illustrative and not intended to limit the scope of the present application in any way. This summary section is neither intended to identify key features or essential features of the claimed subject matter nor intended to act as an auxiliary means for determining the scope of the claimed subject matter.

BRIEF DESCRIPTION OF THE DRAWINGS

The foregoing and other features of the present application will be more fully understood from the following description and the appended claims taken in conjunction with the accompanying drawings. It is to be understood that these drawings depict only a few embodiments of the contents of the present application and should not be construed as limiting the scope of the present application. The contents of the present application will be illustrated more clearly and in more detail with the accompanying drawings.

FIGS. 9A and 9B show SEM images for cavities in a patterned photoresist layer on a substrate according to an example of the present application.

FIG. 10 shows optical and SEM images for CNT-decorated DNA template nanostructures deposited on the substrate after liftoff of the photoresist layer according to an example of the present application.

DETAILED DESCRIPTION OF THE EMBODIMENTS

Figure 1A:
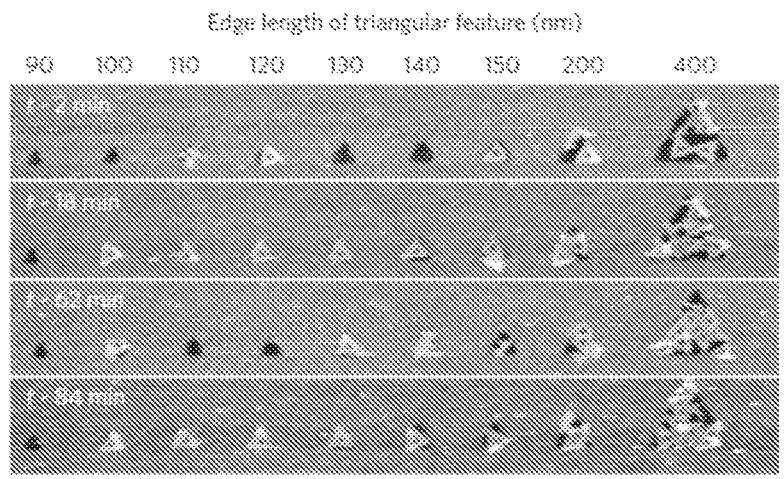
FIG. 1a shows a dynamic binding process of DNA origami onto a patterned surface.

In the following detailed description, reference is made to the accompanying drawings which form a part hereof. In the drawings, similar reference numerals generally refer to similar parts unless the context clearly dictates otherwise. The illustrative embodiments described in the detailed description, drawings and claims are not intended to be limiting. Other embodiments may be employed and other changes may be made without departing from the spirit or scope of the subject matter of the present application. It is to be understood that various configurations, substitutions, combinations and designs of the various forms of the present application, which are generally described in this application and are illustrated in the drawings, are intended to constitute a part of the present application.

Figure 1B:
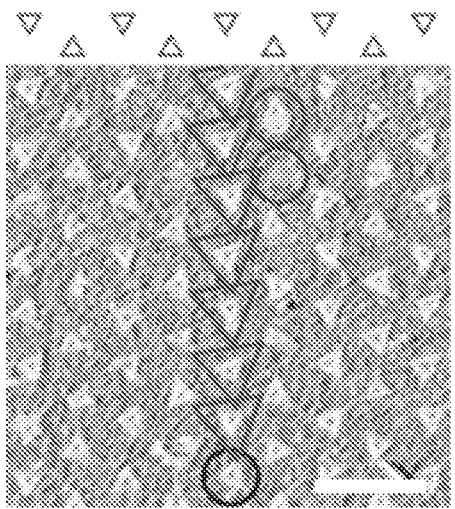
FIGS. 1b and 1c show alignment of DNA origami on substrates after the binding process.
Figure 1C:
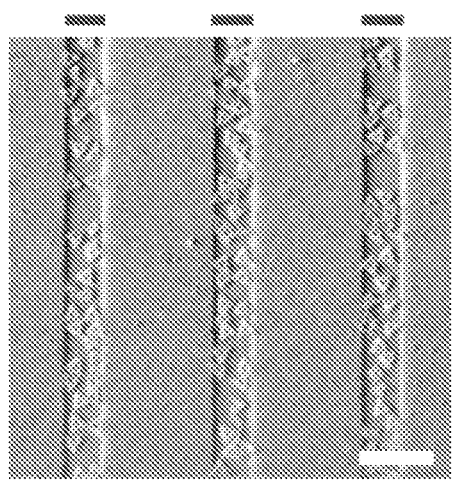

Template nanostructures such as nucleic acid nanostructures that can assemble into a bigger assembly have been used to create complex shapes and extended crystals which may have a periodic structure, including ribbons, tubes, circles, cubes and other types of two-dimensional (2D) crystals and various three-dimensional (3D) crystals or shapes. Such template nanostructures, if modified or decorated with functional nanostructures such as carbon nanotubes (CNTs), can form functional nanostructure arrays with precise placement of the functional nanostructures within the arrays. The functional nanostructures can be organized into nanodevices, circuits or the like. For example, U.S. Pat. No. 7,842,793 provides a method for ex-vivo production of a nucleic acid nanostructure of arbitrary 2D or 3D shape by folding a single stranded DNA polynucleotide scaffold with a plurality of single stranded oligonucleotide helper strands according to a pre-designated folding path. Also, "Yonggang Ke et al., DNA brick crystals with prescribed depths, *Nature Chemistry*, Vol. 6, 994-1002, November 2014" provides a general framework for constructing DNA brick crystals with prescribed depths and nanoscale 3D features such as continuous or discontinuous cavities and channels where functional nanostructures can be placed. U.S. Pat. No. 10,099,920 provides a method for aligning nanoparticles and/or nanowires into nucleic acid nanostructures/crystals. The contents of these patent and non-patent references are all incorporated herein by reference in their entirety. Since template nanostructures are generally developed and formed in solutions, it is desired to place and fix individual template nanostructures on a substrate where various subsequent nanofabrication processes can be applied to further expand the size of an assembly of the template nanostructures to millimeter or centimeter level or even bigger. "Ryan J. Kershner, Placement and orientation of individual DNA shapes on lithographically patterned surfaces, Nature Nanotechnology, Vol. 4, September 2009" provides a method for placing DNA shapes on a substrate by pre-forming patterns with sites on a surface of the substrate. FIG. 1*a* shows a dynamic binding process of DNA origami onto a patterned surface, and FIGS. 1*b* and 1*c* show alignment of DNA origami on the substrate after the binding process. It can be seen that, especially from FIGS. 1*b* and 1*c*, many random positions and orientations of the DNA origami exist on the patterned surfaces due to sites wider than single DNA origami, which are not desired for industrial fabrication since these inaccurate placement and orientation may result in a significant amount of defects. The inaccurate placement of DNA origami is significant especially when the DNA origami to be attached have uneven lengths, for example.

The inventors of the present application have found that conventional template nanostructure placement methods are unsatisfactory because there is a tradeoff between a yield of placing template nanostructure and orientation controllability of the placed template nanostructures on the substrate for such methods. Specifically, a higher yield may require a bigger volume of cavities for accommodating the template nanostructures, which, however, may loosen confinement of the cavities to the template nanostructures and thus renders worse orientation precision of the template nanostructures.

In order to resolve the above problem, specific patterns in alignment layers are provided according to the embodiments of the present application, which can effectively and accurately place individual preformed template nanostructures on a substrate. In some embodiments, these patterned alignment layers have one or more cavities, wherein each cavity contains a nanostructure-accommodating main region and at least one extension regions that extend from and is in fluid communication with the nanostructure-accommodating main region. The main regions can allow the template nanostructures to diffuse thereinto and be contained within the respective cavities on the substrate, maintaining substantially the preformed shapes of the template nanostructures. But the extension regions cannot accommodate the whole structures of the preformed template nanostructures with their preformed shapes being maintained. For example, the extension regions may be sized to have a size smaller than that of the template nanostructures so that the template nanostructures cannot be contained within the extension regions. Furthermore, the extension regions may be shaped to have a shape different from and not matching with that of the template nanostructures. As a result, the template nanostructures cannot diffuse into the extension regions and contained therein. In other words, the extension regions cannot accommodate the whole structures of the template nanostructures due to the size limitation or shape mismatch. However, the extension regions can increase significantly the volume of the cavities and thus improve the possibility of containing template nanostructure(s) during a process of diffusing the template nanostructures into the cavities. Furthermore, in some embodiments, the orientation of the template nanostructures can be precisely controlled by the shape and/or size of the nanostructure-accommodating main region. In this way, both the yield and the orientation controllability can be improved significantly.

Figure 2:
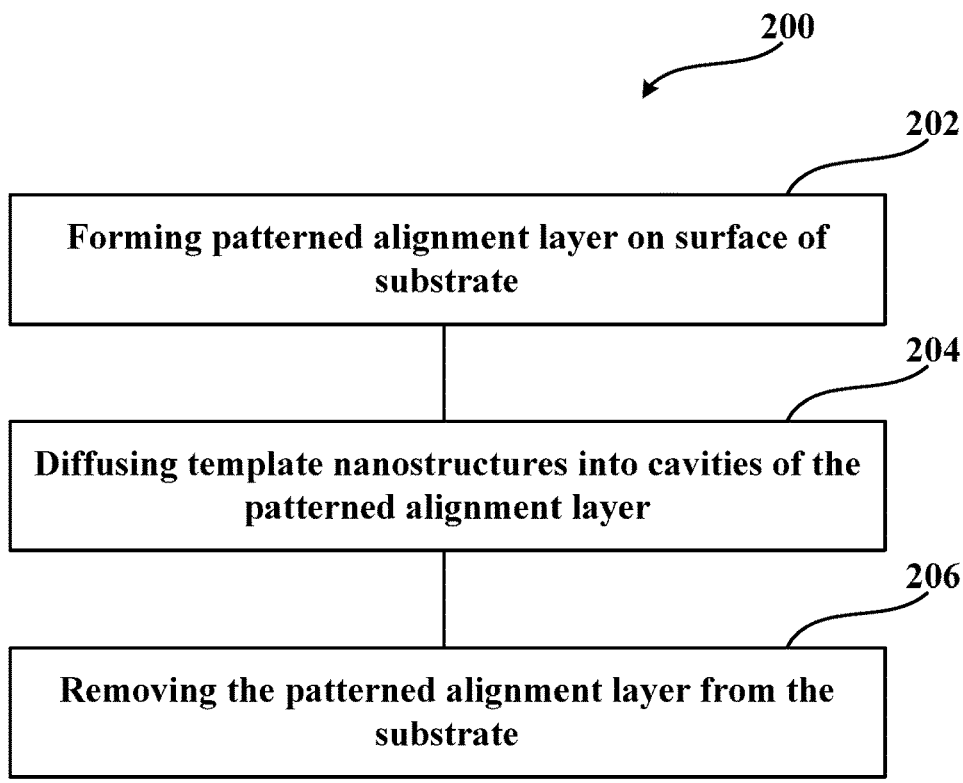
FIG. 2 shows a method for depositing nanostructures on a substrate according to an embodiment of the present application.

FIG. 2 shows a method 200 for depositing nanostructures on a substrate according to an embodiment of the present application.

In some embodiments, the template nanostructures can comprise one or more substances selected from the group consisting of carbon nanotubes (CNTs), polymer-wrapped CNTs, CNT films, semiconductor nanoparticles, semiconductor nanowires, semiconductor nano-bricks, metal nanoparticles, metal nanowires, metal nano-bricks, polymeric nanoparticles, polymeric nanowires, polymeric nano-bricks, ceramic nanoparticles, ceramic nanowires, ceramic nano-bricks, metal oxide nanoparticles, metal oxide nanowires, metal oxide nano-bricks, fluoride nanoparticles, fluoride nanowires and fluoride nano-bricks. In some embodiments, the nucleic acid template nanostructure may include one or more deoxyribonucleic acid (DNA) nanostructures, one or more ribonucleic acid (RNA) nanostructures, one or more locked nucleic acid (LNA) nanostructures, one or more peptide nucleic acid (PNA) nanostructures, or the combination of any of these nanostructures.

In some embodiments, each template nanostructure can be decorated with functional nanostructure(s). The functional nanostructure(s) can comprise one or more substances selected from the group consisting of carbon nanotubes (CNTs), polymer-wrapped CNTs, CNT films, semiconductor nanoparticles, semiconductor nanowires, semiconductor nano-bricks, metal nanoparticles, metal nanowires, metal nano-bricks, polymeric nanoparticles, polymeric nanowires, polymeric nano-bricks, ceramic nanoparticles, ceramic nanowires, ceramic nano-bricks, metal oxide nanoparticles, metal oxide nanowires, metal oxide nano-bricks, fluoride nanoparticles, fluoride nanowires and fluoride nano-bricks. The functional nanostructure(s) can be regarded as a part of the template nanostructure(s).

As shown in FIG. 2, the method 200 starts with step 202 in which a patterned alignment layer is formed on a surface of a substrate. In some embodiments, the substrate may include, without limitation, silicon, silicon dioxide (also referred to as silica), aluminum oxide, sapphire, germanium, gallium arsenide (GaAs), an alloy of silicon and germanium, or indium phosphide (InP). In some embodiments, the substrates may include silicon nitride, carbon, and/or polymer. In some embodiments, the substrate may be inorganic or organic. In some embodiments, the substrate may include graphene and/or graphite. In some embodiments, the substrate is a hybrid (e.g., includes a mixture) of any two or more materials (e.g., a hybrid of an inorganic material and an organic material, or a hybrid of two or more different inorganic materials or organic materials). For example, a substrate may include a mixture of inorganic and organic materials, a mixture of two or more different inorganic materials, or a mixture of two or more different organic materials. In some embodiments, a substrate includes a semiconductor material or a mixture of semiconductor materials. Semiconductor materials include, without limitation, Group IV elemental semiconductors, Group IV compound semiconductors, Group VI elemental semiconductors, Group III-V semiconductors, Group II-VI semiconductors, Group I-VII semiconductors, Group IV-VI semiconductors, Group IV-VI semiconductors, Group V-VI semiconductors, Group II-V semiconductors, oxides, layered semiconductors, magnetic semiconductors, organic semiconductors, charge-transfer complexes and combinations thereof. It can be appreciated by those skilled in the art that the substrate can have a planar surface, a curved surface, or have surfaces with 3D features all of which the patterned alignment layer can be formed on. For example, some cavities of the patterned alignment layer may be higher than the other cavities of the patterned alignment layer. Also, some substrates may have 3D features with vertically orientated surfaces, horizontally orientated surfaces (e.g. side walls) and/or sloping surfaces if the substrate is placed horizontally. Accordingly, the cavities can be formed on either or all of the vertically orientated surfaces, horizontally orientated surfaces or sloping surfaces.

The patterned alignment layer has one or more cavities to guide the deposition of the template nanostructures on the substrate. The template nanostructures may have generally predefined shapes and dimensions which generally do not change during the deposition on the substrate. In some embodiments, each of the one or more cavities has a depth of 2 or more folds, preferably 5 or more folds, than a thickness of the template nanostructures. Each cavity has a main region for accommodating at least one template nanostructure, and a plurality of extension regions extending from the main region and in fluid communication with the main region. The extension regions have a size and shape that are not fit for accommodating the whole structure of the template nanostructures and thus the template nanostructure can only be received within the main region. In some embodiments, a non-patterned alignment layer, such as a photoresist layer (e.g. poly(methyl methacrylate) (PMMA)), may be formed on the surface of the substrate. For example, the photoresist layer may be formed using a spin-coating process or a spraying process. The alignment layer may then be patterned using lithography to form the cavities having desired shapes and/or sizes at respective locations on the substrate. In some embodiments, electro-beam lithography can be used to pattern the alignment layer because finer patterns with sub 10-nm resolution can be formed. It can be appreciated that other types of patterning process such as photolithography, imprint lithography, directed self-assembly of block copolymers and the like can be used. In some embodiment, other types of materials including polymers and inorganic materials can be used as the alignment layer. For example, polydimethylsiloxane (PDMS) or silicon oxide can be used as the alignment layer.

Figure 3:
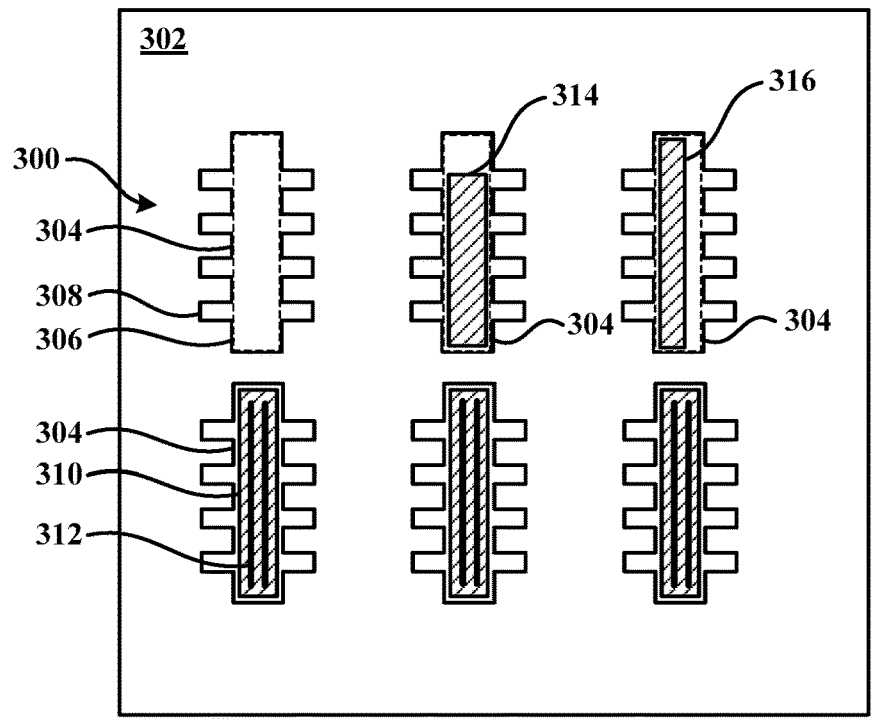
FIGS. 3, 4a-4b and 5-7 show exemplary patterned alignment layers on a substrate according to embodiments of the present application.

FIG. 3 shows an exemplary patterned alignment layer 300 on a substrate 302 according to an embodiment of the present application. As shown in FIG. 3, the substrate 302 has a surface on which a patterned alignment layer 300 with six cavities 304 are formed. The number of cavities in the patterned alignment layer is for illustrative purpose only and not intending to limit the scope of the present application. Specifically, the upper left cavity 304 has a rectangular main region 306 and several extension regions 308 extending laterally from a periphery of the main region 306. It can be appreciated by those skilled in the art that a size and shape of the main region 306 may be determined according to the shape of the template nanostructure(s) to be accommodated therein. For example, the main region 306 may have a circular shape, a triangular shape, a trapezoid shape, a rectangular shape or the like depending on what is to be accommodated. In some embodiments, the size and shape of the main region 306 may be to the same as that of the template nanostructure(s) or bigger, as long as the template nanostructure(s) can be accommodated during subsequent processes detailed below. In some embodiments, the extension regions 308 may have a smaller size compared with the main region 306 and/or may have a depth equal to, greater than or less than that of the main region 306. In some embodiments, the extension regions 308 are formed with the main region 306 during the patterning process and thus they may have a substantially equal depth. The extension regions 308 increase a volume of the cavity 304. In some embodiments, the plurality of extension regions 308 of each cavity have a volume of 1%, 2%, 3%, 4%, 5% or more, preferably 10% or more, of that of the main region 306. In some embodiments, each extension regions 308 may have an area or volume of 1% to 30% of that of the main region 306.

Figure 4A:
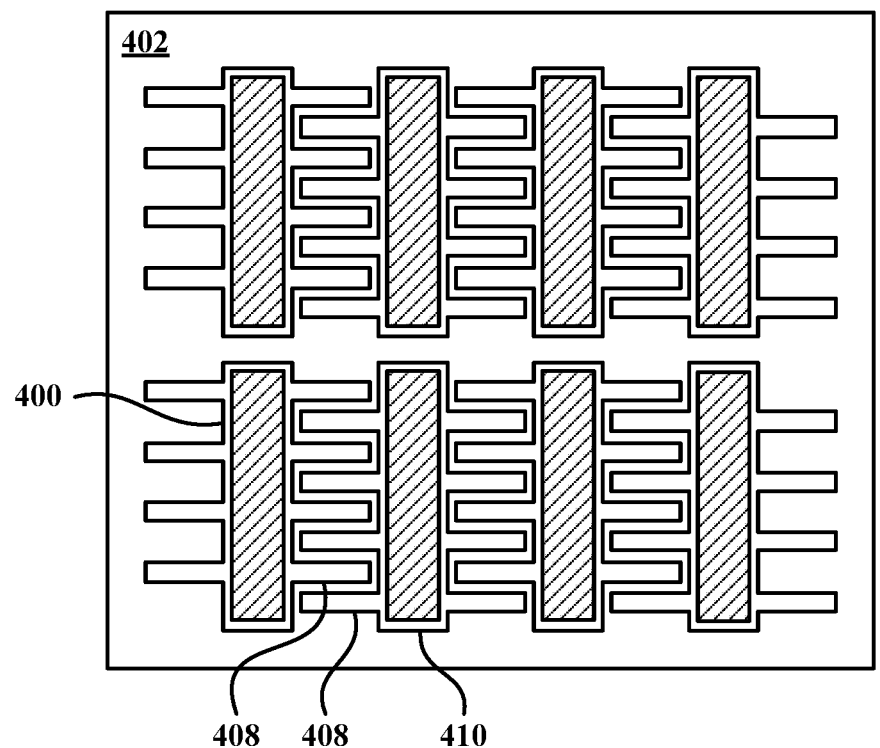
Figure 4B:
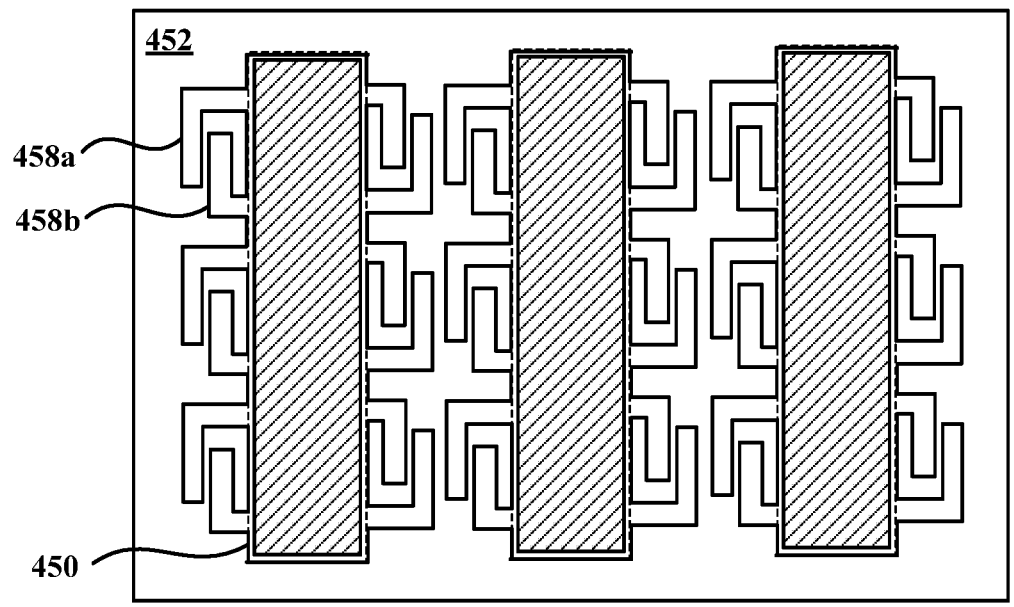

In the embodiment shown in FIG. 3, the extension regions 308 have the same rectangular shape. In some other embodiments, the extension regions may have other shapes such as diamond, triangle, helix, circle, semicircle, trapezoid or any other regular or non-regular shapes which are suitable for increasing the volume of the cavities but cannot accommodate the template nanostructures. In some embodiments, a width or length of the extension region may be smaller than a width of the template nanostructure to be accommodated in the main region such that template nanostructure(s) cannot be accommodated within the extension region. FIGS. 4a and 4b show exemplary cavities having extension regions with other shapes or arrangements. As shown in FIG. 4a, eight cavities 400 are formed on a substrate 402. The cavities 400 have rectangularly shaped extension regions 408 which are arranged in a comb-fingered manner. Furthermore, the extension regions 408 of each two neighboring cavities 400 can be inserted into but not intersecting with each other at their adjacent sides. In this way, the spacing between two neighboring cavities 400 can be reduced to increase a density of the cavities 400 on the substrate 402. In some embodiments, the extension regions may have shapes different from each other. As shown in FIG. 4b, three cavities 450 are formed on a substrate 452. The cavities 450 all have six groups of extension regions, and each group includes a first folded extension region 458a and a second folded extension region 458b which is folded inside of the first folded extension region 458a. The folded shapes of the extension regions 458a and 458b can reduce spacing between neighboring cavities 450 and thus increase a density of the cavities 450 on the substrate 452. It can be appreciated by those skilled in the art the comb-fingered extension regions shown in FIG. 4a and the folded extension regions shown in FIG. 4b are exemplary and can be changed into other shapes as long as the designed shape and arrangement of the cavities can meet requirement on minimum linewidth provided by the patterning process such as electrobeam lithography.

Referring back to FIG. 2, in step 204, template nanostructures such as nucleic acid nanostructures are diffused into the one or more cavities of the patterned alignment layer. The template nanostructures may be contained in a pre-developed solution. For example, a multi-stage isothermal reaction may generate a solution containing designated nucleic acid nanostructures. In an example, a mixture of unpurified DNA bricks, buffer materials such as Tris (Tris(hydroxymethyl)aminomethane), nuclease inhibitors such as EDTA (ethylene diamine tetraacetic acid) and metal salts such as $MgCl_2$ to stabilize the DNA bricks can be incubated following a predefined heating curve to develop nucleic acid brick crystals as a type of nucleic acid nanostructures. In some embodiments, the nucleic acid nanostructures may be further modified or decorated with functional nanostructures such as CNTs, and thus appropriate wrapping process in reaction buffers can be performed before step 204 to wrap the functional material nanostructures onto the nucleic acid nanostructures. For example, the solution with nucleic acid nanostructures can be mixed with NaCl or $MgCl_2$ solution or the like containing CNTs and subsequently incubated. More detailed examples for forming nucleic acid nanostructures decorated with functional nanostructures can be referred to U.S. Pat. No. 10,099,920, the content of which is incorporated herein by reference in its entirety. However, it can be appreciated by these skilled in the art, any other types of template nanostructures decorated or not decorated with functional nanostructures can be formed in any desired methods, whether existing or developed in the future, and these template nanostructures can be deposited on the substrate into the cavities maintaining substantially their pre-formed shapes.

In some embodiments, functional nanostructures such as proteins can be attached onto the nucleic acid nanostructures, allowing biological experiments on complex assemblies of proteins and creation of molecular electronic or plasmonic circuits. Also, metal (e.g. Ag, Au, Cu or Pt), alloy (e.g. alloys including one or more of Ag, Au, Cu, Pt or Si), semiconductor (e.g. Si, GaAs, InP, $MoS_2$, $TiO_2$), conductive metal oxides (e.g. $In_2O_3$, $SnO_2$, $Na_2Pt_3O_4$), superconductors (e.g. $Yba_2Cu_3O_7$, $Ti_2Ba_2Ca_2Cu_3O_{10}$) and/or magnetic nanoparticles or nanowires, fluorescent semiconductor quantum dots or any other desired nanostructures may be attached to the nucleic acid nanostructures as functional nanostructures. These functional nanostructures can be used in forming various nanodevices, circuits, optical devices and so on, depending on post processing to the substrate.

In some embodiments, the diffusing step 204 may further include dipping the solution onto the patterned alignment layer and incubating the substrate. The dipping step and the incubating step can be executed at the same time or subsequently. Incubating the substrate helps the template nanostructures to diffuse into the cavities in the patterned alignment layer. For example, incubating the substrate can be implemented by dehydrating or evaporating. In some embodiments, the substrate can be incubated in a sealed chamber for a determined interval, e.g. five minutes, ten minutes, thirty minutes or longer, to leave enough time for attaching the template nanostructures within the cavities firmly. In some other embodiments, the substrate can be placed in an open environment or space to have the solvents at least partially evaporated. The diffusing step 204 may be implemented by other ways. For example, electrophoresis can be used to deposit the template nanostructures onto the substrate.

With reference to FIG. 3, the lower row includes three cavities 304 each filled with a template nanostructure 310. The template nanostructures 310 have a size and shape substantially the same as the cavities 304. As such, the template nanostructures 310 are confined and orientated on the substrate 302 as desired. In some embodiments, the template nanostructures 310 may include functional nanostructure arrays which have been previously attached. For example, two CNTs 312 that are in parallel with each other are attached to the template nanostructure 310 in the lower left cavity 304. In this way, the two CNTs 312 can be precisely placed and orientated as a functional nanostructure array, which further forms a bigger nanostructure array with four other CNTs 312 in the lower middle and lower right cavities 304.

In some other embodiments, the main region 306 may have a size and shape greater than that of the template nanostructures to be placed therein. For example, the main region 306 of the upper middle cavity has a length greater than that of a template nanostructure 314, and thus the template nanostructure 314 can only move in a lengthwise direction of the main region. Similarly, the main region 306 of the upper right cavity 304 has a width greater than that of a template nanostructure 316, and thus the template nanostructure 316 can only move in the widthwise direction of the main region. It can be seen that, although these main regions may have a bigger size, they can still orientate the template nanostructures 314 and 316 because at least one translation degree of freedom of the template nanostructures 314 and 316 along the surface of the substrate 302 is limited. As such, the patterned alignment layer with such cavities shows a high prospect in depositing template nanostructures with uneven lengths, which is impossible for existing methods requiring exact matching of dimension and surface energy between nucleic acid nanostructures and the patterned alignment layer used in these methods.

Although at least a width or length of the main regions of the cavities shown in FIG. 3 is substantially equal to that of the template nanostructures. In some embodiments, the main regions may have a size and shape greater than the template nanostructures. For example, both the width and length of the main regions (e.g. rectangularly shaped) are greater than those of the template nanostructures, respectively. Although such sized and shaped cavities may not fully orientate template nanostructures received therein, the possibility to have template nanostructures diffused into the cavities can be increased due to an increased volume of the cavities.

The extension regions 308 cannot accommodate the at least one template nanostructure. In other words, the extension regions 308, either individually or collectively (even bridged by the main region), cannot accommodate the whole structure of the template nanostructure. As such, the template nanostructures can only be accommodated within the main regions, and further confined according to the shapes of the main regions. However, the extension regions 308 which are in fluid communication with the respective main regions can increase a total volume of the cavities. In some embodiments, one cavity may have extension regions that may increase the volume of a cavity by at least 5%, or preferably by 10%, 20%, 30%, 50%, 100%, 150%, 200% or higher, compared with a cavity with only the main region. In some other embodiments, one or more other cavities may also have extension regions that increase their respective volumes similarly. As aforementioned, the extension regions 308 can increase significantly the volume of the cavities and thus improve the possibility of containing template nanostructure(s) during a process of diffusing the template nanostructures into the cavities, without degrading the orientation of the template nanostructures accommodated therein.

Figure 5:
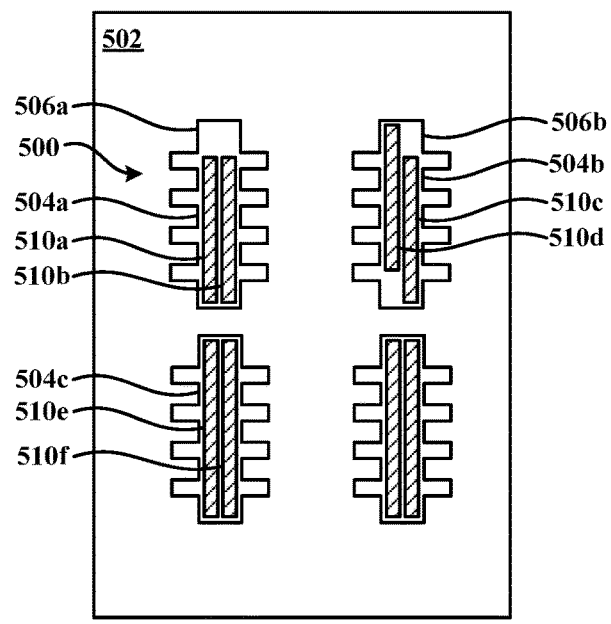

FIG. 5 shows another exemplary patterned alignment layer 500 on a substrate 502 according to an embodiment of the present application. Similar to those cavities 304 shown in FIG. 3, cavities in the patterned alignment layer 500 have multiple extension regions to increase their respective volumes, improving a yield to contain template nanostructures therein.

As shown in FIG. 5, four cavities are formed in the patterned alignment layer 500, and each of the cavities are filled with two template nanostructures within their respective main regions. Specifically, the upper left cavity 504a is filled with two template nanostructures 510a and 510b which have a shorter length than the main region 506a of the cavity 504a. However, the two template nanostructures 510a and 510b each have a width substantially equal to a half of the width of the main region 506a, and therefore, when they are accommodated within the main region 506a in parallel with each other, their orientation is generally fixed and cannot change. Similarly, the upper right cavity 504b is also filled with two template nanostructures 510c and 510d which are shorter than the main region 506b. Different from the template nanostructures 510a and 510b, the template nanostructures 510c and 510d do not align with each other in the lengthwise direction. However, if functional nanostructures decorated in these template nanostructures 510c and 510d are placed lengthwise, like the CNTs 312 shown in FIG. 3, such non-alignment may not significantly affect further fabrication of nanodevices or circuits based thereon. In some preferred embodiments, the main regions of the cavities in the patterned alignment layer may be precisely designed to accommodate a desired number and size of template nanostructures. For example, the lower left cavity 504c may have a length substantially equal to that of the template nanostructures 510e and 510f and a width substantially two folds of the width of the template nanostructures 510e and 510f. In this way, the assembled nanostructures 510e and 510f are confined within the main region 504c with no degree of freedom along the surface of the substrate 502.

Figure 6:
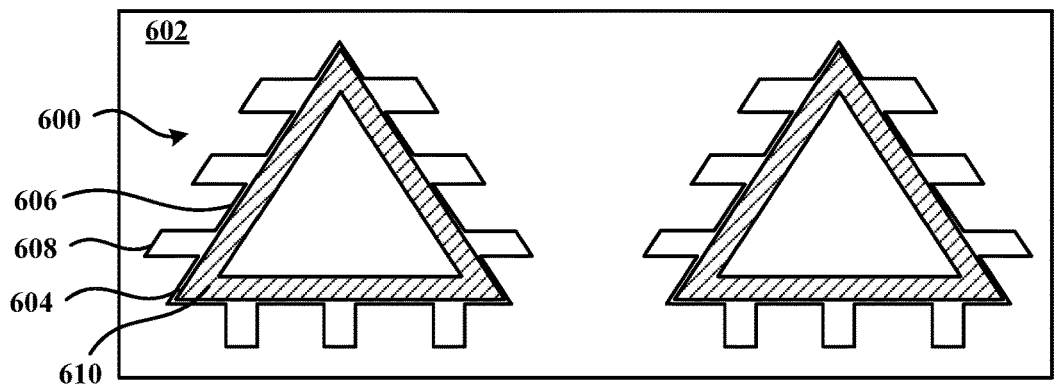

FIG. 6 shows another exemplary patterned alignment layer 600 on a substrate 602 according to an embodiment of the present application. As shown in FIG. 6, the alignment layer 600 has cavities 604 for accommodating a template nanostructure 610 which is shaped as a triangular loop. A main region 606 of the cavity 604 is similarly of a triangular shape that fits for the outline of the template nanostructure 610. Furthermore, multiple parallelogram or triangular extension regions 608 extend from three sides of the triangular main region 606 to increase the volume of the cavity 604, respectively.

Figure 7:
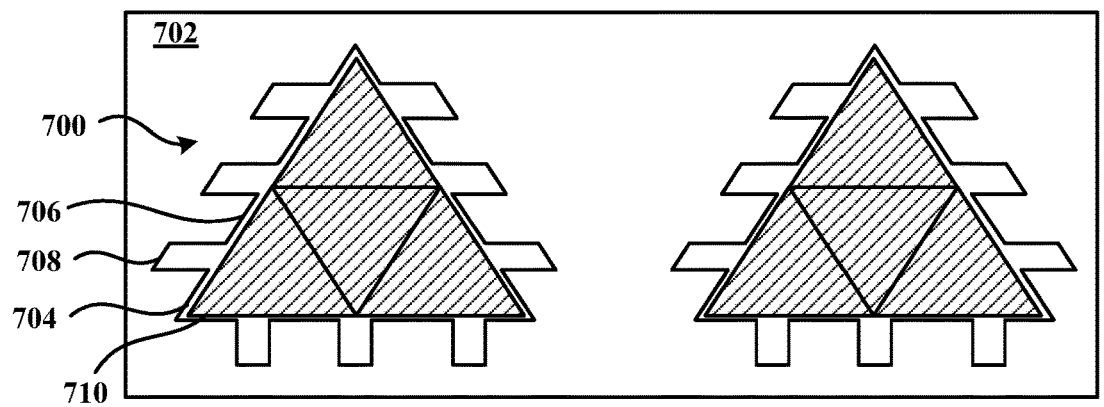

FIG. 7 shows another exemplary patterned alignment layer 700 on a substrate 702 according to an embodiment of the present application. As shown in FIG. 7, the alignment layer 700 has two cavities 704 each of which is for accommodating four triangular template nanostructures 710 assembled together therein. A main region 706 of the cavity 704 is of a triangular shape that fits the outline of the assembled four template nanostructures 710. Furthermore, multiple parallelogram or rectangular extension regions 708 extend from three sides of the triangular main region 706 to increase the volume of the cavity 704. Since the extension regions 708 can help the template nanostructures 710 to accumulate and diffuse into the cavities 704, it is easier to assemble the triangular template nanostructures 710 into a bigger triangular shape as desired.

Referring back to FIG. 2, in some embodiment, before step 204, the method 200 may include differentiating the substrate to improve the adhesivity of the surface of the substrate to the template nanostructures. For example, a dry oxidative etching of the substrate with the patterned alignment layer can be used to process the surface of the substrate exposed through the cavities. It can be appreciated that various differentiating processes can be used in the differentiating step. For example, in some embodiments, physically differentiating such as glowing discharge the substrate, i.e. oxygen plasma to bombard the substrate, can also be used.

After step 204 where the template nanostructures are diffused into the cavities of the patterned alignment layer, the patterned alignment layer can be removed from the substrate in step 206, leaving only the template nanostructures attached on the substrate. In some embodiments, the patterned alignment layer may be removed using liftoff process. It can be appreciated by those skilled in the art that there may be some template nanostructures attached on top of the patterned alignment layer in step 204. As such, these portion of template nanostructures can also be removed along with the patterned alignment layer.

Figure 8A:
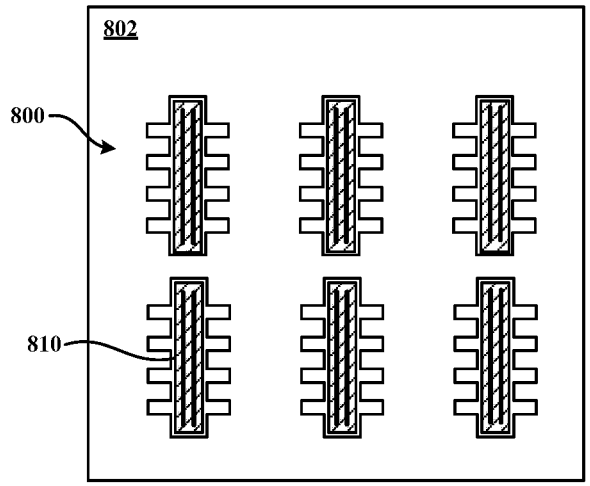
FIGS. 8a-8d show changes on a substrate during a process for depositing a functional material nanostructure array on the substrate.
Figure 8B:
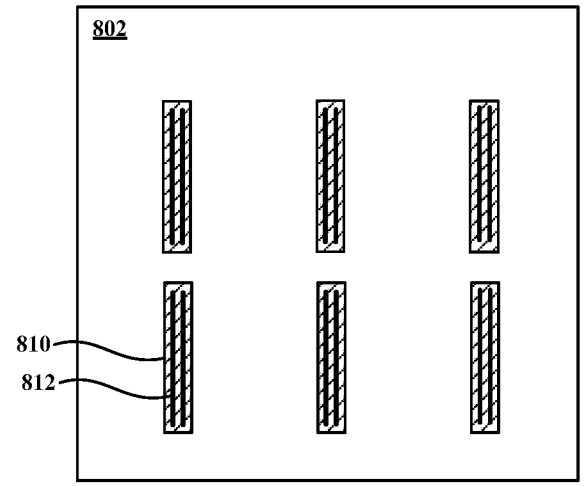
Figure 8C:
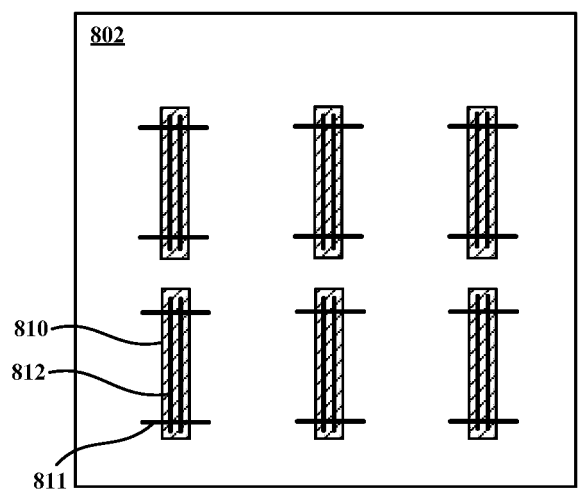
Figure 8D:
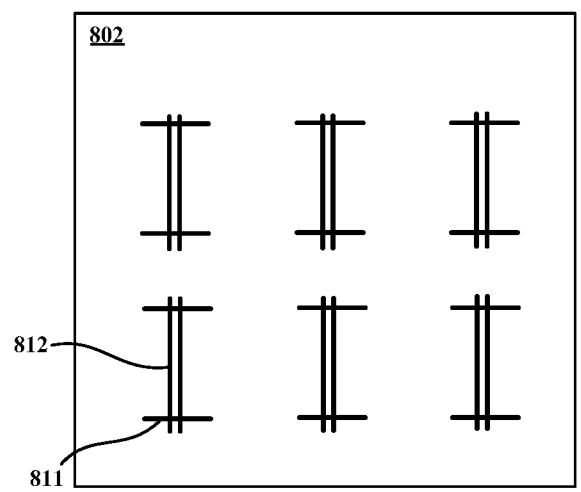

FIGS. 8a and 8b show an exemplary substrate 802 with a patterned alignment layer 800 and without the patterned alignment layer, respectively. As shown in FIGS. 8a and 8b, after removing the patterned alignment layer 800, the remaining template nanostructures 810 form a nanostructure array maintaining the original positional relationship defined by the removed patterned alignment layer 800. Furthermore, each of the template nanostructures 810 is decorated with two functional nanostructures 812 such as CNTs. In some embodiments, the non-functional parts of the template nanostructures 810 (i.e., except for the functional nanostructures) can be further removed to leave only the functional nanostructures 812 on the substrate 802, as shown in FIG. 8d. For example, when the template nanostructures 810 are nucleic acid nanostructures, nucleic acid molecules of the nucleic acid nanostructures can be removed by an oxidant solution such as hydrogen peroxide solution. Preferably, prior to removing the nucleic acid molecules, certain fixation structures can be formed on the substrate 802, to fix the nucleic acid nanostructures 810, especially the functional nanostructures 812, on the substrate 802. For example, as shown in FIG. 8c, metal bars, polysilicon bars or other inorganic material bars 811 superimposing over the functional nanostructures 812 can be formed with anchors fixed onto the surface of the substrate 802 where no nucleic acid nanostructure is covered, as shown in FIG. 8c. The fixation structures can remain on the substrate when the nucleic acid nanostructures 810 are removed. For more details of the fixation structure, a PCT application No. PCT/CN2020/082375 filed on Mar. 31, 2020 and entitled "Method for forming nanostructure and field effect transistor device on substrate" and another PCT application No. PCT/CN2020/082778 filed on Apr. 1, 2020 and entitled "Method for forming nanostructure and field effect transistor device on substrate" can be refereed to, the entire content of which is incorporated herein by reference.

It can be appreciated that, in some embodiments, the template nanostructures attached on the substrate are not decorated with functional nanostructures, and the template portion (e.g. nucleic acid nanostructures) of the template nanostructures themselves are desired nanostructures to form a nanostructure array. As such, the removing of the template portion of the template nanostructures described above may not be needed and some other post-processing can be applied to the template nanostructures on the substrate. Similarly, when both the template portion and the functional nanostructures are desired, the removing of the template portion may not be needed. In some embodiments, either or both the template portion or the functional nanostructures may include two or more substances, and removing one or more of the substances of the template portion and the functional nanostructures can be performed. For example, the functional nanostructures may be DNA-wrapped CNTs, which can be attached to nucleic acid template nanostructures, and the DNAs wrapping the CNTs can be removed with the nucleic acid template nanostructures to leave only the CNTs remain on the substrate.

Example 1

A sample nanostructure array consisting nucleic acid nanostructures has been generated using the method according to an embodiment of the present application. Specifically, a 0.35 $cm^2$ sized silicon substrate (coated with 300 nm thick $SiO_2$) was spin-coated with a PMMA photoresist (model number: AR-P 672.045 by Allresist GmbH). The PMMA photoresist was patterned to form desired cavities using electro-beam lithography (model number: Voyager by Raith GmbH, with an exposure dose of 325 $uC/cm^2$ at 0.9 nA current). The patterned PMMA photoresist layer was then developed in a developing solution (1:3 mixture of methylisobutyl ketone (MIBK) and isopropyl alcohol (IPA)) to remove the exposed portion of the PMMA photoresist. Afterwards, the substrate was rinsed with IPA and dried with nitrogen. FIGS. 9A and 9B show SEM images for the cavities in the patterned PMMA photoresist layer on the substrate. As shown in FIGS. 9A and 9B, each of the cavities have an elongated main region and multiple extension regions laterally extending from the main region. The scale bars are 40 μm in FIG. 9A and 2 μm in FIG. 9B. After patterning, the patterned PMMA photoresist layer within one write-field of the SEM imaging has $5 \times 10^4$ PMMA cavities (surface density~$2 \times 10^7$ cavities/$cm^2$). Each PMMA cavity exhibited 2.5 μm in length, 180 to 250 nm in width and 150 nm in depth. It can be seen that the extension regions significantly increase the volume of the cavities.

Next, a solution (5 uL) of CNT-decorated DNA nanostructures was dipped onto the patterned PMMA photoresist, and then the substrate was kept in a sealed chamber for 2 hours. Each of the CNT-decorated DNA nanostructures contains an assembled fixed-width CNT array with prescribed inter-CNT pitch of 16 nm and two CNTs. During this process, the DNA nanostructures diffused into the cavities in the patterned PMMA photoresist layer. The substrate was then dried, followed by PMMA liftoff in acetone, leaving only the DNA nanostructures previously diffused within the cavities on the substrate. FIG. 10 shows optical and SEM images for CNT-decorated DNA nanostructures formed on the substrate after liftoff of the PMMA photoresist layer. As shown in FIG. 10, the upper left image is the optical image of the 0.35 $cm^2$ sized silicon substrate. The rest three image are zoomed-out and zoomed-in (the rectangular boxes show selected areas for zoomed-in view) SEM images of the silicon substrate with the DNA nanostructures. The scale bars are 10 μm in the lower left image, 1 μm in the middle image and 500 nm in the right image, respectively. The arrows in the right image show the DNA nanostructures. It can be seen that the DNA nanostructures are precisely placed and orientation as desired (relative to the cavity arrangement shown in FIGS. 9A and 9B).

Under SEM based counting, more than 85% (~600 cavities were counted) of the initial PMMA cavities in the patterned PMMA photoresist layer were occupied by the CNT-decorated DNA nanostructures. The measured angular distribution, which was defined as the difference between the longitudinal axis of DNA nanostructures and the lengthwise direction of the PMMA cavities on the substrate, was 56% within ±1° and 90% within ±7° for all the remaining DNA nanostructures within the 600 cavities occupied. The measured angular distribution combined the impacts from the fabrication defects of the PMMA cavities, the variation during DNA placement, and the disturbance during PMMA liftoff. Notably, the angular distribution improved significantly when compared to previous report in large-scale placement of DNA templated inorganic materials (see A. M. Hung et al., Large-area spatially ordered arrays of gold nanoparticles directed by lithographically confined DNA origami, Nature Nanotech. 5, 121-126 (2010)).

Figure 11:
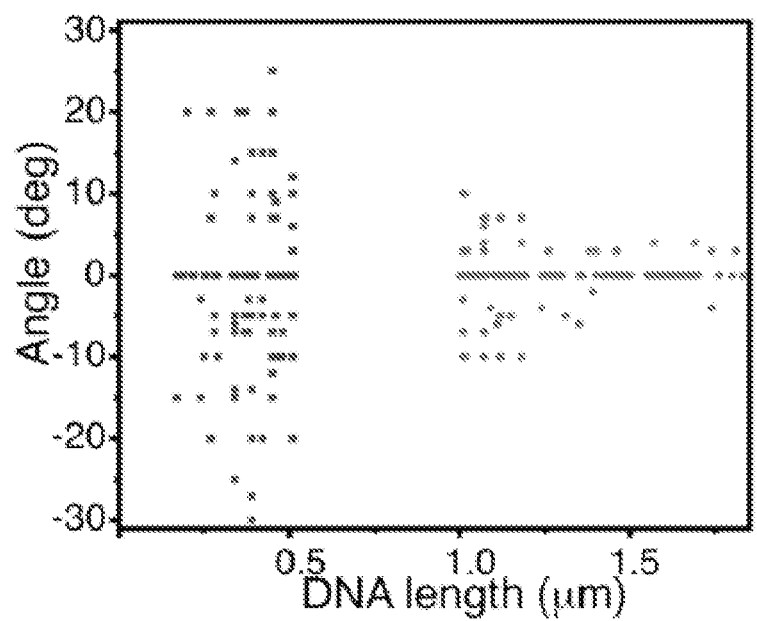
FIG. 11 shows a plot of angular distribution of the aligned DNA nanostructures diffused into the PMMA cavities versus the lengths of the DNA nanostructures according to an example of the present application.

Both the lengths of the DNA nanostructures and the aspect ratio of the PMMA cavities may affect the angular distribution. Longer DNA nanostructures (length>1 μm) may exhibit narrower angular distribution (0°±3.4°) than that of shorter DNA nanostructures (length <500 nm, 1°±11°). FIG. 11 shows a plot of angular distribution of the aligned DNA nanostructures diffused into the PMMA cavities versus the lengths of the DNA nanostructures. In addition, PMMA cavities with higher length-to-width aspect ratio (e.g. 10 or higher) may provide better orientation controllability than that with lower aspect ratio (e.g. 1 to 2 or lower). Hence, to further improve the angular distribution, longer DNA nanostructures, as well as higher length-to-width aspect ratio of the PMMA cavities, may be beneficial. In some embodiments, anisotropic shaped nucleic acid nanostructures (e.g. elongated nucleic acid nanostructures) to be deposited on the substrate may have a length of 500 nm or longer, or preferably 1 μm, 2 μm, 5 μm or longer. Moreover, in some embodiments, a length-to-width aspect ratio of the cavities within the patterned alignment layer may be 2 or higher, or preferably 5, 10, 20, 30 or higher.

Generally, with the methods according to embodiments of the present application, anisotropic bio or non-bio nanostructure arrays can be aligned and attached within prefabricated cavities over centimeter-scale substrates. In some preferred embodiments, effective spatial confinement and orientation of nanostructure arrays can be achieved, which is applicable to both regular and irregular nanostructures.

Example 2

Example 2 is an example for constructing high-performance transistors that the methods according to embodiments of the present application can be used.

In projected high-performance energy-efficient field-effect transistors (FETs) (Reference 1, Reference 2), evenly-spaced small-pitch (spacing between two adjacent channels within individual FET) semi-conductor channels are often required. Smaller channel pitch leads to higher integration density and on-state performance, but with the risk of enhanced destructive short-range screening and electrostatic interactions in low-dimensional semiconductors, such as carbon nanotubes (CNTs) (Reference 3); whereas evenly-spaced alignment minimizes the channel disorder that impacts the switching between on/off states (Reference 4).

Therefore, although high-density CNT thin-films exhibit on-state performance comparable with Si FETs (Reference 5, Reference 6), degraded gate modulation and increased subthreshold swing (Reference 3, Reference 5) are observed because of the disorder in the arrays.

Biomolecules such as DNAs (Reference 7, Reference 8) can be used to organize CNTs into prescribed arrays (Reference 9—Reference 11). Based on the spatially hindered integration of nanotube electronics (SHINE), biofabrication further scales the evenly-spaced channel pitch beyond lithographic feasibility (Reference 12). However, none of the biotemplated CNT FETs (Reference 12—Reference 14) have exhibited performance comparable with those constructed from lithography (Reference 15) or thin-film approaches (Reference 3, Reference 5, Reference 6, Reference 16—Reference 18). Meanwhile, during the surface placement of biotemplated materials, broad orientation distributions (Reference 19) prevent their large-scale alignment.

Here, we show that small regions of nanometer-precise biomolecular assemblies can be integrated into the large arrays of solid-state high-performance electronics. We used the parallel semiconducting CNT arrays assembled through SHINE as model systems (Reference 12). At the FET channel interface, we observed lower on-state performance induced by high-concentration DNA/metal ions. Using a rinsing-after-fixing approach, we eliminated the contamination without degrading CNT alignment. Based on the uniform inter-CNT pitch and clean channel interface, we constructed solid-state multichannel PMOS (p-channel metal-oxide-semiconductor) CNT FETs displaying high on-state performance and fast on/off switching simultaneously. Using lithography-defined polymethyl methacrylate (PMMA) cavities to spatially confine the placement of the CNT-decorated DNA templates, we demonstrated aligned arrays with prescribed geometries over a 0.35-cm² area substrate. Building high-performance ultra-scaled devices at the biology-electronics interface may enable diverse applications in the post-Si era, such as multiplexed biomolecular sensors (Reference 20) and 3D FETs, with nanometer-to-centimeter array scalability.

Figure 16:
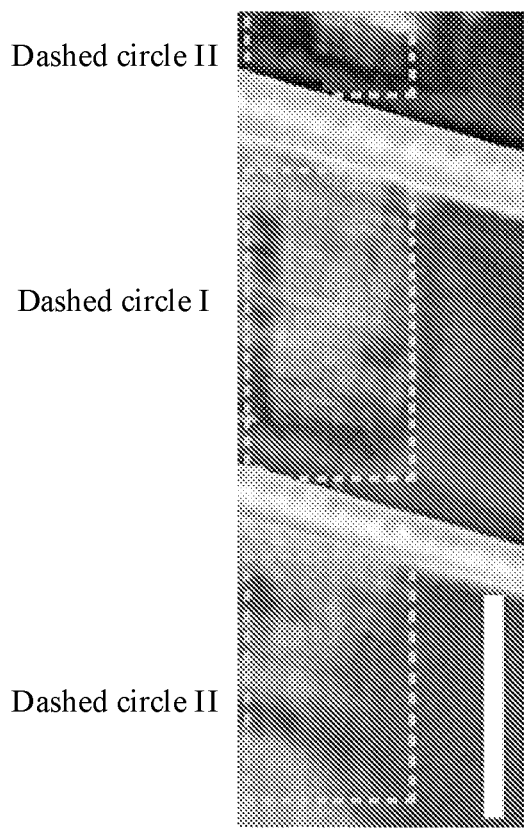
FIG. 16 shows SEM image of fixed CNT array after DNA removal. In the dashed circle I area, both ends of CNTs were fixed by two metal bars, and used for FET construction. In the dashed circle II areas, the unfixed CNT ends may be disturbed during DNA removal, and were not used for FET construction. The scale bar is 500 nm.
Figure 17:
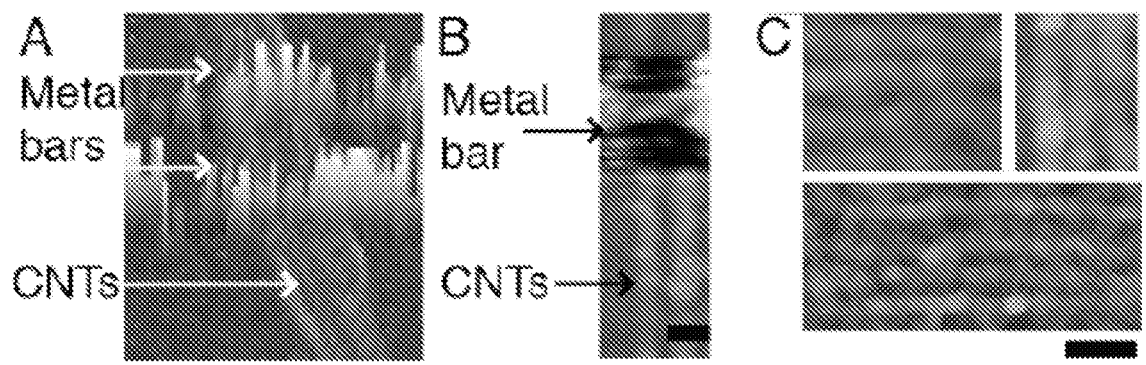
FIG. 17 shows AFM images of the fixed CNT arrays after DNA removal. (A) 3D zoomed-out view of the CNT arrays fixed by two metal bars. (B) zoomed-in view of CNTs fixed by metal bar. The scale bar is 25 nm. (C) more zoomed-in AFM images of the fixed CNT arrays after DNA removal. The scale bar is 50 nm.
Figure 18:
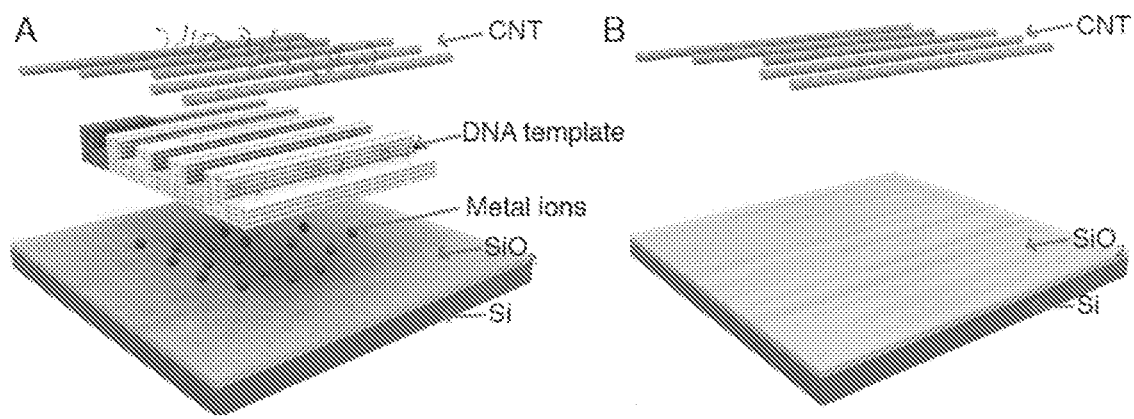
FIG. 18 shows schematics for different compositions at channel interface. (A) after assembly and (B) after removing DNA templates and metal ions.

We assembled DNA-templated CNT arrays using DNA-based SHINE (Reference 12). We applied a rinsing-after-fixing approach (FIG. 12A) to remove DNA templates. Starting from the surface-deposited DNA-templated CNT arrays, both ends of the DNA-templated CNT arrays were first fixed onto Si wafer with deposited metal bars (first step in FIG. 12A). DNA templates and high-concentration metal salts (1 to 2 M) within DNA helices were gently removed through sequential rinsing with water and low-concentration $H_2O_2$ (second step in FIG. 12A and FIG. 18). The inter-CNT pitch and the alignment quality of the assembled CNTs were not degraded during the rinsing (FIG. 12B, FIGS. 16 and 17).

Figure 12:
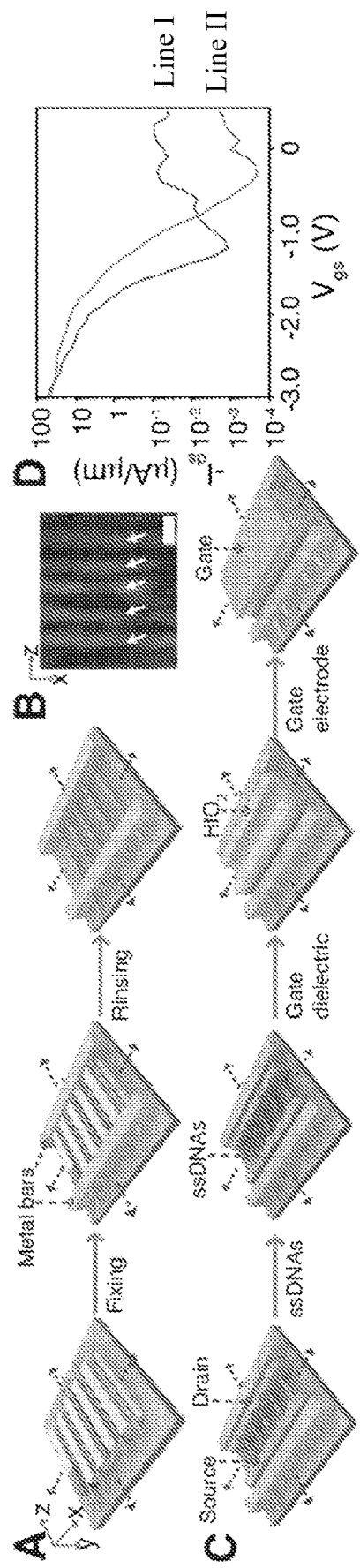
FIG. 12 shows multichannel CNT FETs with ssDNAs at channel interface. (A) Design schematic for the rinsing-after-fixing approach. (B) Zoomed-in AFM image along the x and z projection direction for CNT arrays after template removal. The scale bar is 25 nm. See also FIGS. 16 and 17. (C) Design schematic for introducing ssDNAs at channel interface and FET fabrication. (D) The $I_{ds}$-$V_{gs}$ curves (plotted in logarithmic at $V_{ds}$ of –0.5 V) for multichannel DNA-containing CNT FET before (Line I) and after (Line II) thermal annealing. See also FIG. 20.
Figure 19:
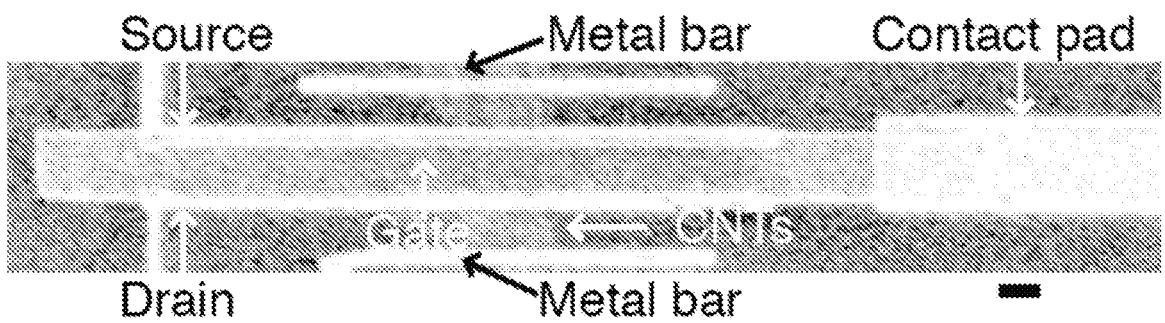
FIG. 19 shows Zoomed-out SEM image of the constructed multichannel DNA-containing CNT FET. The scale bar is 200 nm.

To explore the impact of single-stranded DNAs (ssDNAs) at channel interface, we first fabricated the source and drain electrodes onto the rinsed CNT arrays (FIG. 12C, left). Next, ssDNAs were introduced exclusively into the predefined channel area (first step in FIG. 12C, channel length of 200 nm). Finally, gate dielectric of $HfO_2$ and gate electrode of Pd were sequentially fabricated (second and third steps in FIG. 12C and FIG. 19).

Figure 20:
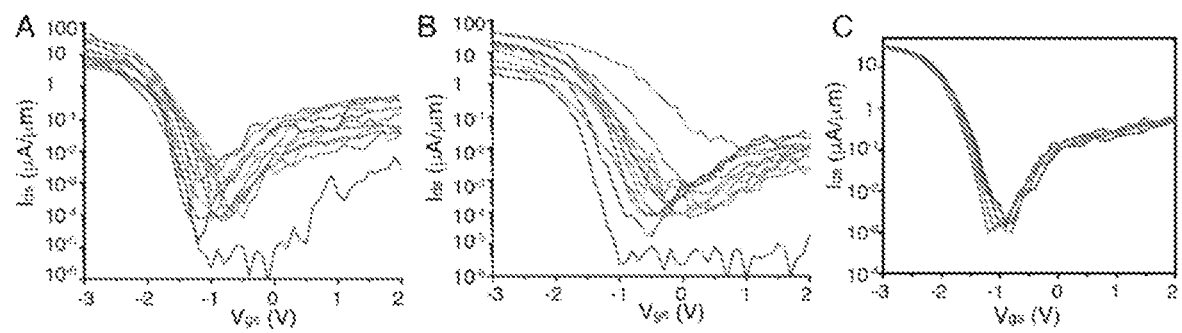
FIG. 20 shows the $I_{ds}$-$V_{gs}$ curves for multichannel DNA-containing CNT FETs. The CNT FETs before (A) and after (B) thermal annealing. Different lines represent distinct CNT FETs. (C) one DNA-containing CNT FET in (A) under repeated measurements from 2V to –3V Different lines represent distinct measurements. The $V_{ds}$ in (A), (B), and (C) were all set at –0.5 V. Ids was normalized to the inter-CNT pitch.

Out of 19 FETs we constructed, 63% (12 out of 19) showed typical gate modulation ($I_{on}/I_{off}$ exceeded $10^3$, FIG. 20). The other 7 devices exhibited $I_{on}/I_{off}$<5, which was caused by the presence of metallic CNTs within the array. At a source-to-drain bias ($V_{ds}$) of −0.5 V, one typical multichannel DNA-containing CNT FET (FIG. 12D) exhibited threshold voltage ($V_{th}$) around −2 V, on-current density of 50 μA/μm at gate-to-source bias ($V_{gs}$) of −3 V (normalized to inter-CNT pitch), subthreshold swing of 146 mV/decade, peak transconductance ($g_m$) of 23 μS/μm, and on-state conductance ($G_{on}$) of 0.10 mS/μm. Statistics over all the 12 operational FETs exhibited $V_{th}$ distribution of −2±0.10 V, on-current density of 4-50 μA/μm, and subthreshold swing of 164±44 mV/decade (FIG. 20A). The transport performance was stable during repeated measurements (FIG. 20C).

Figure 29:
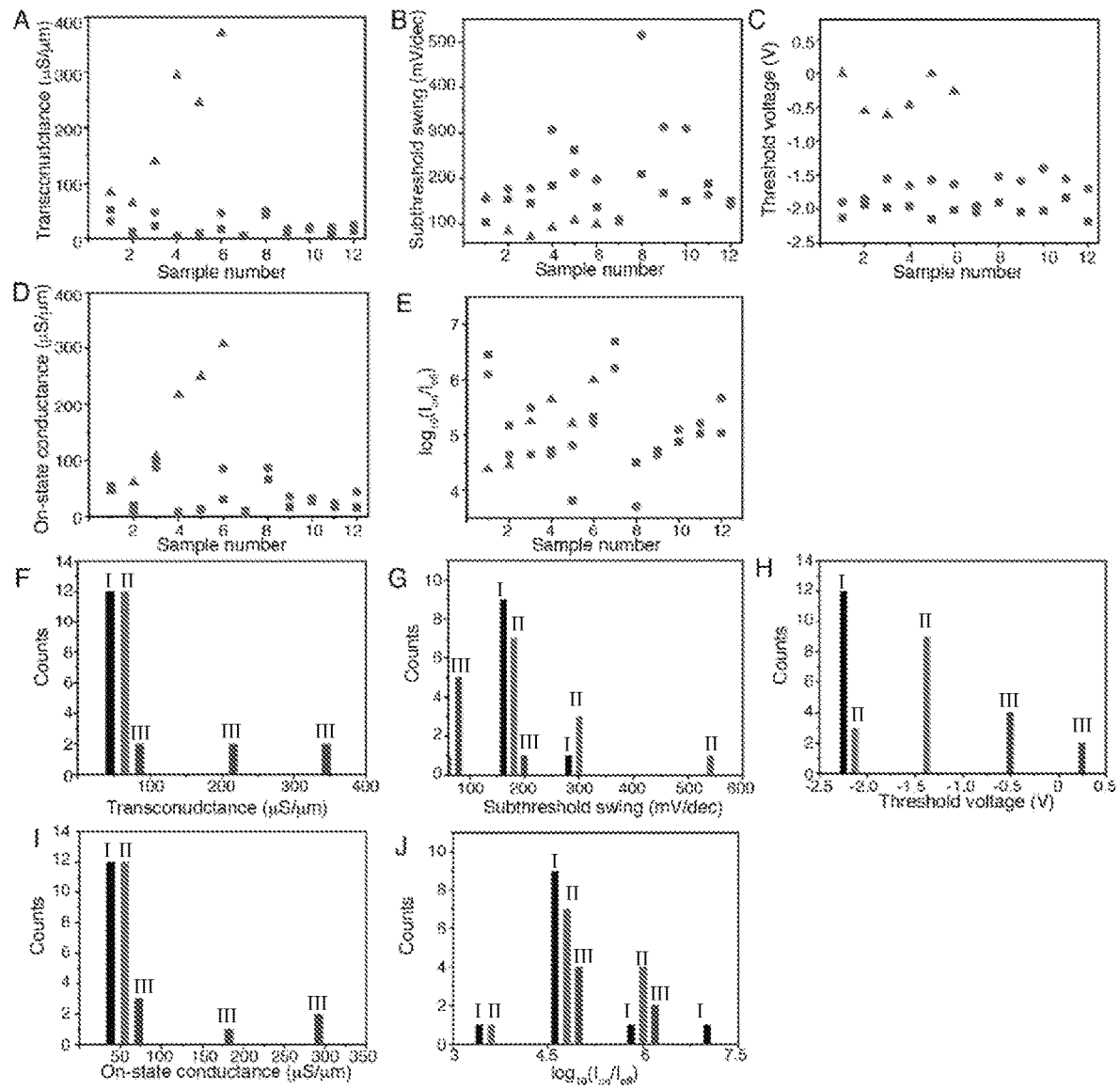
FIG. 29 shows performance comparisons for the constructed multichannel CNT FETs with different interfacial compositions. From (A) to (E), transconductance, subthreshold swing, threshold voltage, on-state conductance, and $I_{on}/I_{off}$ are compared for different FET samples. Squares represent multichannel DNA-containing CNT FETs before annealing. Circles represent thermal-annealed multichannel DNA-containing CNT FETs. Triangles represent multichannel DNA-free CNT FETs. Sample number was the assigned testing number for each FET. From (F) to (J), statistics of transconductance, subthreshold swing, threshold voltage, on-state conductance, and $I_{on}/I_{off}$ for different channel compositions. Bars I represent multichannel DNA-containing CNT FETs before annealing. Bars II represent thermal-annealed multichannel DNA-containing CNT FETs. Bars III represent multichannel DNA-free CNT FETs. All the performance data were acquired at the $V_{ds}$ of −0.5 V. For multichannel DNA-containing CNT FETs before and after annealing, the performance data were acquired at the $V_{gs}$ of −3.0 V. For multichannel DNA-free CNT FETs, the performance data were acquired at the $V_{gs}$ of −1.5 V.

We annealed the above DNA-containing FETs at 400° C. for 30 min under vacuum to thermally decompose ssDNAs (Reference 22), and then recharacterized the transport performance. Compared to the unannealed samples, thermal annealing (FIG. 12D, FIGS. 19 and 29) slightly shifted the average $V_{th}$ (around 0.35 V, $V_{th}$ of −1.65±0.17 V after annealing), and increased the average subthreshold swing by ~70 mV/decade (subthreshold swing of 230±112 mV/decade after annealing). Other on-state performance, including $g_m$ and $G_{on}$, as well as FET morphology, did not substantially change after annealing.

Figure 13:
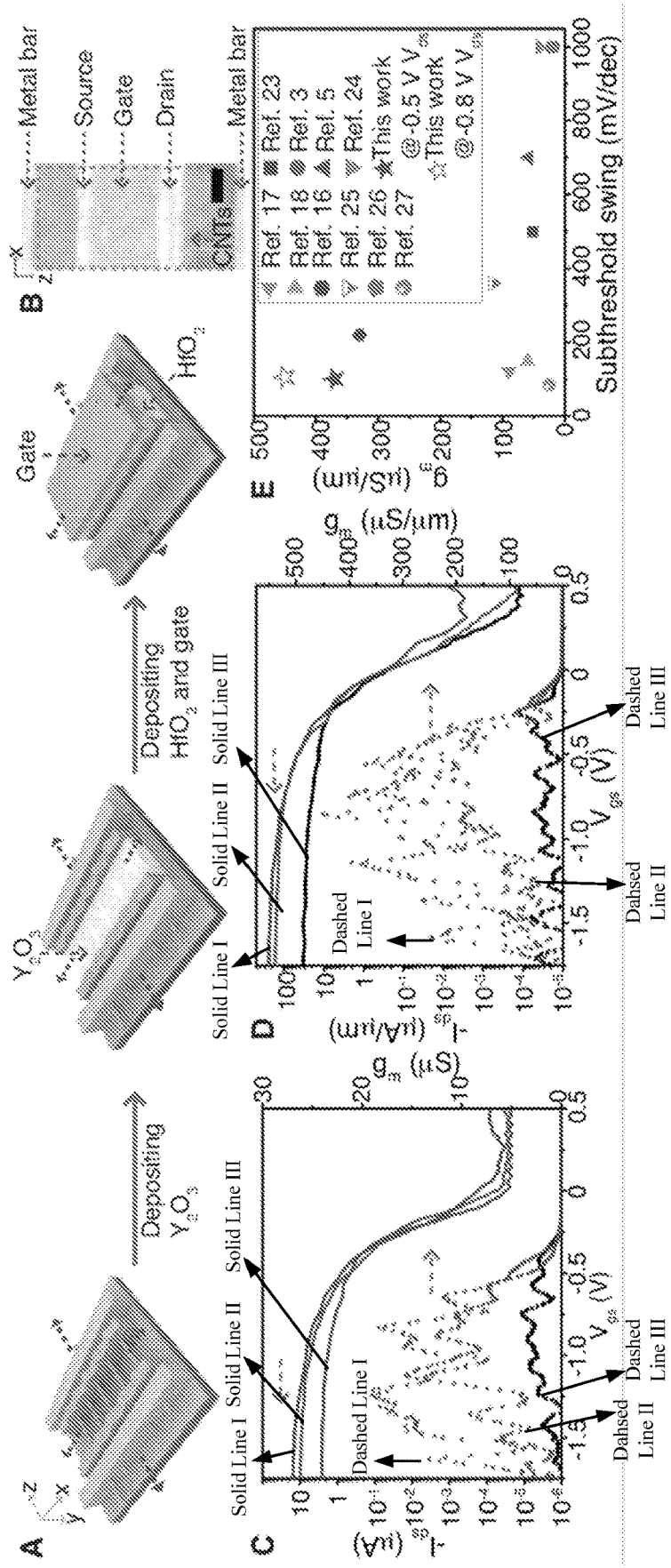
FIG. 13 shows constructing top-gated high-performance CNT FETs. (A) Design schematic for the fabrication of top-gated DNA-free FETs. (B) Zoomed-in SEM image along the x and z projection direction for the constructed multi-channel CNT FE T. Dashed circle indicates the assembled CNT arrays. The scale bar is 100 nm. See also FIG. 24. (C and D) The $I_{ds}$-$V_{gs}$ curves (solid line, left axis, plotted in logarithmic scale) and $g_m$-$V_{gs}$ curves (dotted line, right axis, plotted in linear scale) for single-channel (C) and multichannel (D) CNT FETs. Lines I, Lines II and Lines III in C and D represent $V_{ds}$ of –0.8 V, –0.5 V, and –0.1 V, respectively. See also in FIGS. 22 and 25. (E) Benchmarking of current multichannel CNT FET in D with other reports of high-performance CNT FETs. Device performance from previous publications (References 3, 5, 16 to 18, 23 to 27) are obtained at $V_{ds}$ of –0.5 V and channel lengths ranging from 100 nm to 500 nm. See also in FIGS. 30 and 31.
Figure 21:
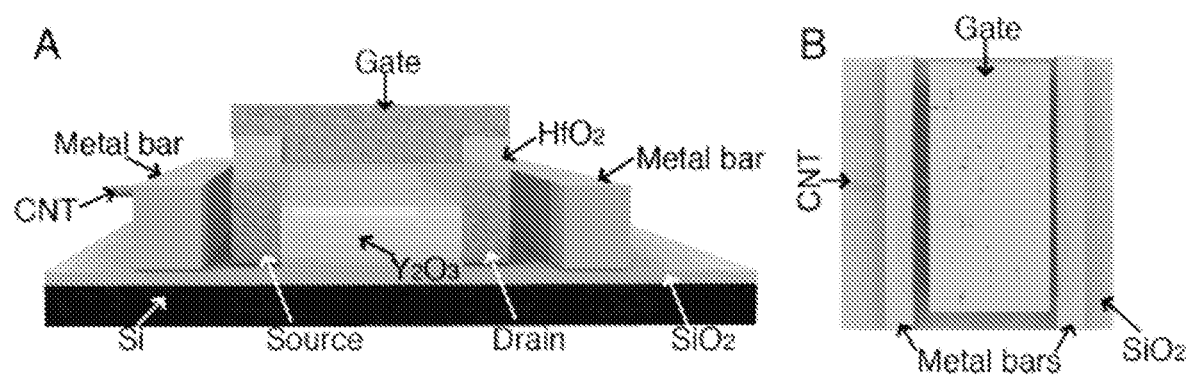
FIG. 21 shows design scheme of the constructed single-channel DNA-free CNT FET. (A) side view and (B) top view of the FET design.
Figure 22:
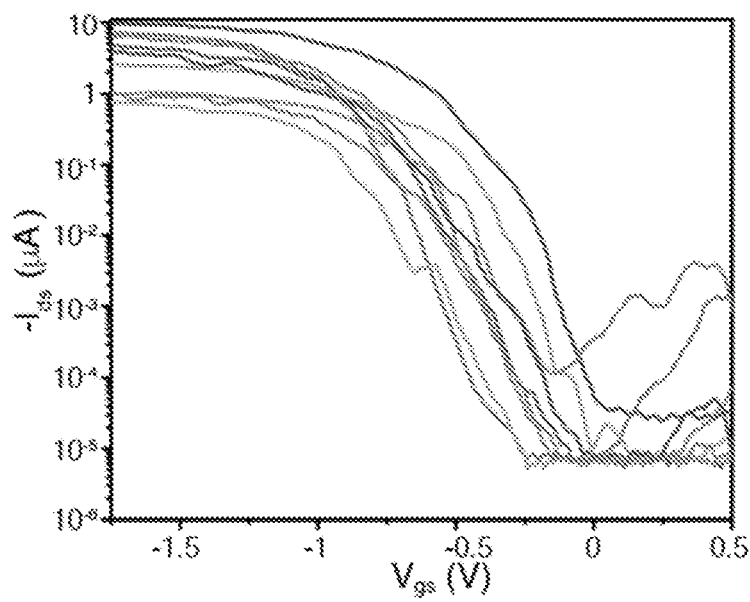
FIG. 22 shows the $I_{ds}$-$V_{gs}$ curves for all the operational single-channel DNA-free CNT FETs. Different lines represent distinct CNT FETs. The $V_{ds}$ was set at −0.5 V.
Figure 23:
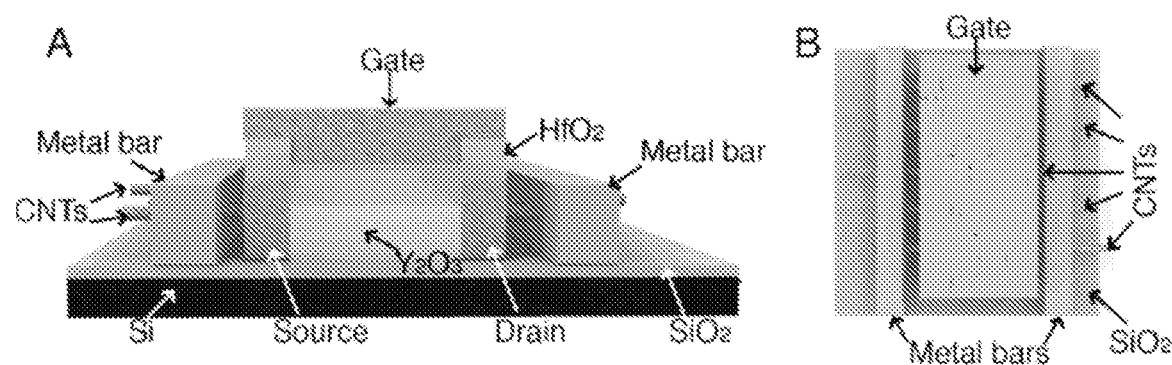
FIG. 23 shows design scheme of the constructed multichannel DNA-free CNT FET. (A) side view and (B) top view of the FET design.
Figure 24:
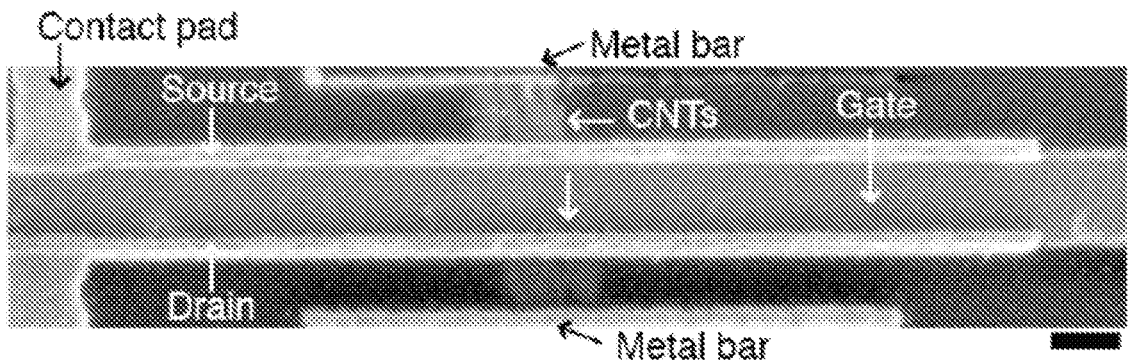
FIG. 24 shows zoomed-out SEM image of the constructed multichannel DNA-free CNT FET. The scale bar is 200 nm.
Figure 25:
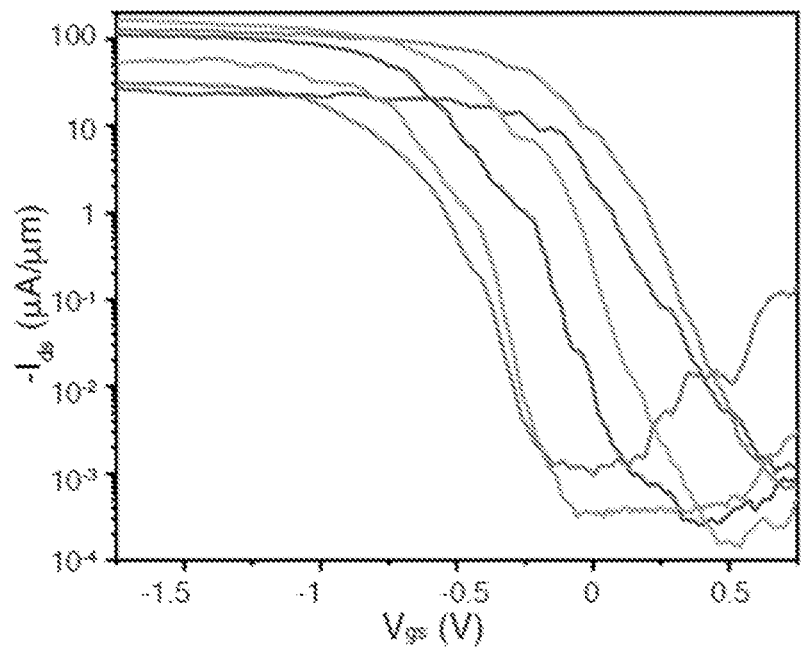
FIG. 25 shows the $I_{ds}$-$V_{gs}$ curves for the all the operational multichannel DNA-free CNT FETs. Different lines represent distinct CNT FETs. $I_{ds}$ was normalized to the inter-CNT pitch. The $V_{ds}$ was set at −0.5 V.
Figure 28:
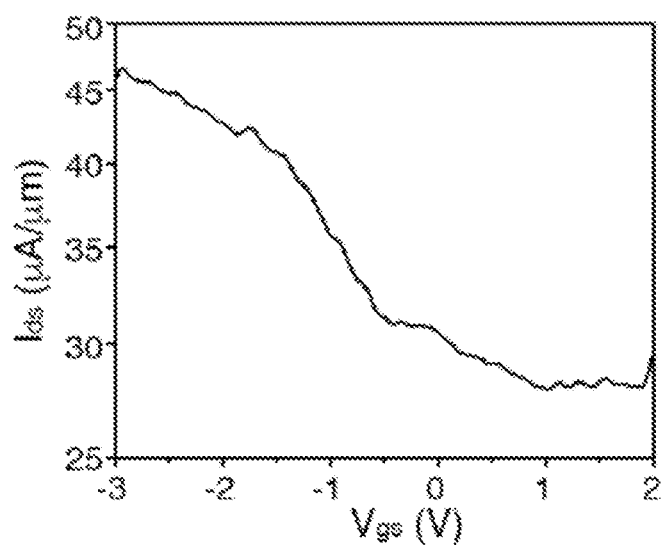
FIG. 28 shows the $I_{ds}$-$V_{ds}$ curve for the multichannel DNA-free CNT FET containing metallic CNT impurity. The $V_{ds}$ was set at −0.5 V. Ids was normalized to the inter-CNT pitch.

To build high-performance CNT FETs from biotemplates, we deposited a composite gate dielectric ($Y_2O_3$ and $HfO_2$) into the rinsed channel area, instead of introducing ssDNAs (FIG. 13, A and B, FIGS. 23 and 24). Of all the FETs constructed, 54% (6 out of 11) showed gate modulation (FIG. 25). The other 5 out of 11 FETs contained at least one metallic CNT within the channel (FIG. 28). Using identical fabrication process, we also constructed another 9 operational single-channel DNA-free CNT FETs for comparing transport performance (FIG. 21). The single-channel CNT FET (channel length ~200 nm) with the highest on-state performance exhibited on-current of 10 μA/CNT ($V_{ds}$ of −0.5 V) at the thermionic limit of subthreshold swing (i.e. 60 mV/decade, FIG. 13C and FIG. 22).

Figure 26:
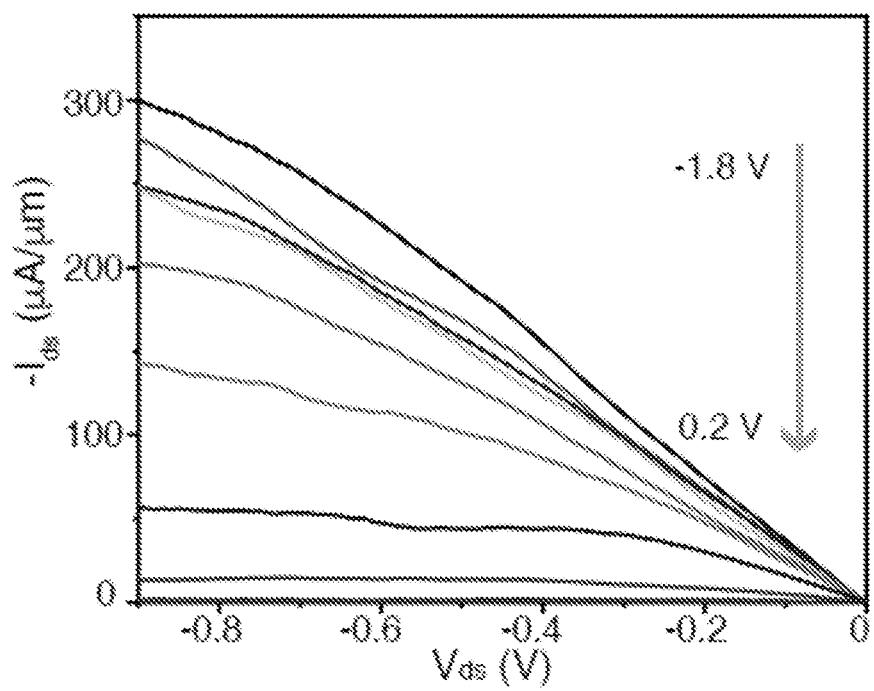
FIG. 26 shows the $I_{ds}$-$V_{ds}$ curves for the multichannel DNA-free CNT FET with highest on-current density at 200 nm channel length. Different lines represent distinct $V_{gs}$. $V_{gs}$ was ranging from −1.8 V to 0.2 V, at a step of 0.2 V. Ids was normalized to the inter-CNT pitch.

At $V_{ds}$ of −0.5 V, the multichannel DNA-free CNT FET (channel length ~200 nm, inter-CNT pitch of 24 nm) with highest on-state performance (FIG. 13D and FIG. 26) exhibited $V_{th}$ of −0.26 V, on-current density of 154 μA/μm (at $V_{gs}$ of −1.5 V), and subthreshold swing of 100 mV/decade. The $g_m$ and $G_{on}$ values were 0.37 mS/μm and 0.31 mS/μm, respectively. The noise in the $g_m$-$V_{gs}$ curve may originate from thermal noise and disorder and scattering within the composite gate construct. On-state current further increased to ~250 μA/μm, alongside with $g_m$ of 0.45 mS/μm and subthreshold swing of 110 mV/decade, at $V_{ds}$ of −0.8 V.

Figure 27:
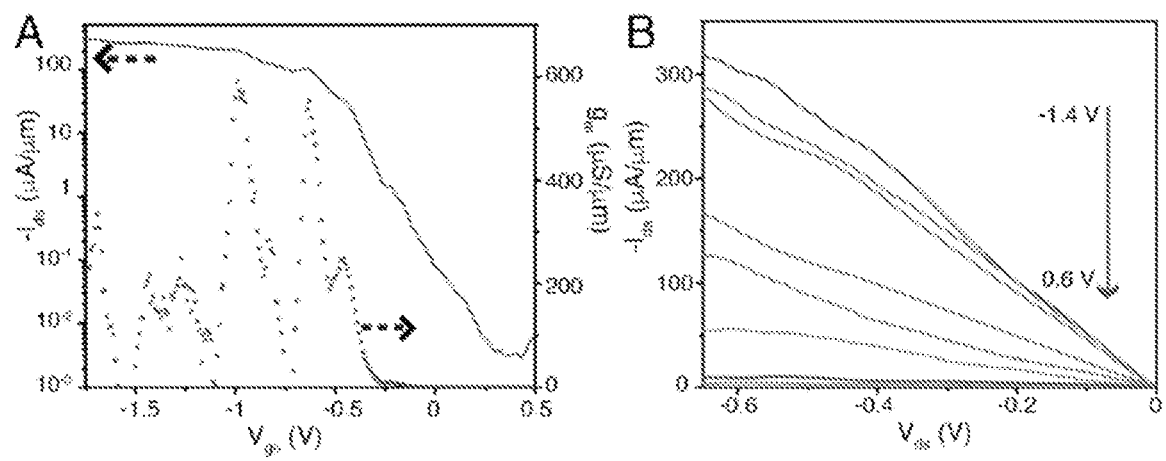
FIG. 27 shows the transport performance for the multichannel DNA-free CNT FET with 100-nm channel length. (A) $I_{ds}$-$V_{gs}$ curve (left axis, plotted in logarithmic scale) and $g_m$-$V_{gs}$ curve (right axis, plotted in linear scale) at $V_{ds}$ of −0.5 V. Both $I_{ds}$ and $g_m$ were normalized to the inter-CNT pitch. (B) $I_{ds}$-$V_{ds}$ curve. Different lines represent distinct $V_{gs}$. $V_{gs}$ was ranging from −1.4 V to 0.6 V, at a step of 0.2 V.

When the channel length scaled to 100 nm, we achieved on-current density of 300 μA/μm (at $V_{ds}$ of −0.5 V and $V_{gs}$ of −1.5 V), and subthreshold swing of 160 mV/decade (FIG. 27). Both the $G_{on}$ and the $g_m$ values were thus promoted to 0.6 mS/μm. The DNA-free CNT FETs exhibited comparable $I_{ds}$ to thin-film FETs from aligned chemical vapor deposition (CVD)-grown CNT arrays (Reference 28, Reference 29), even at 60% smaller CNT density (~40 CNTs/μm vs. more than 100 CNTs/μm in (Reference 28, Reference 29)). The effective removal of the contaminations, such as DNA and metal ions, and shorter channel length contributed to the high $I_{ds}$. Notably, a previous study fixed CNTs directly with the source and drain electrodes (Reference 13), but because contamination could not be fully removed from the electrode contact areas, the on-state performance ($g_m$ and $G_{on}$) decreased by a factor of 10.

Figure 30:
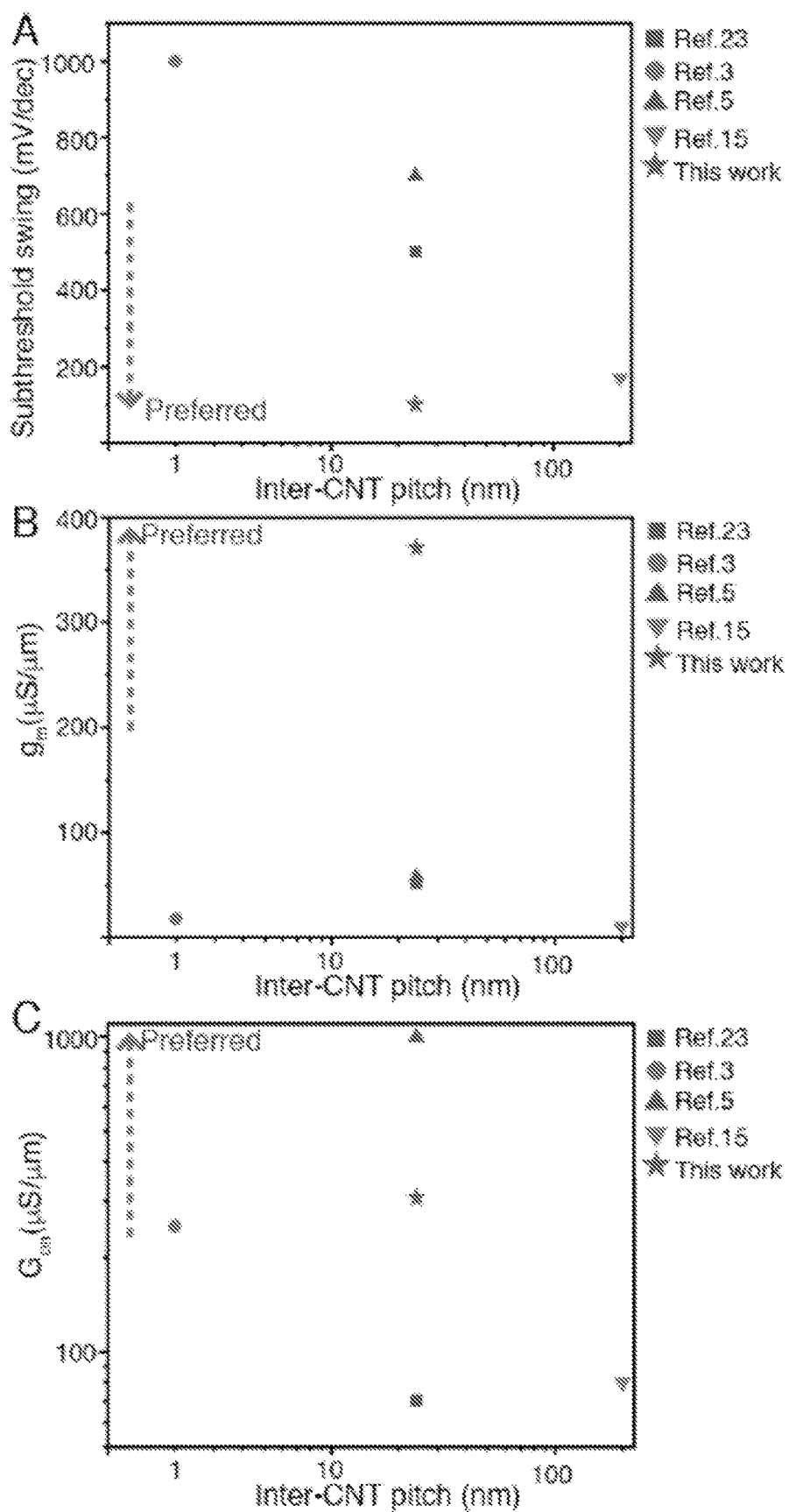
FIG. 30 shows benchmarking of CNT FETs with different inter-CNT pitches. Benchmarking of our multichannel CNT FET with other reports (even inter-CNT pitches) regarding: (A), subthreshold swing, (B), transconductance ($g_m$), and (C), on-state conductance ($G_{on}$). Device performance from previous publications (References 3, 5, 15, 23) are obtained at $V_{ds}$ of −0.5 V. Specifically, the transport performance are obtained from FIG. 4D in (Reference 23), FIGS. 4A and 4C in (Reference 3), FIGS. 2A and 2B in (Reference 5) and FIGS. 3C and 4B in (Reference 15). Channel lengths are ranging from 100 nm to 500 nm. In each panel, transport performance (i.e. subthreshold swing, on-state conductance, and transconductance) are plotted vs. structural parameter (inter-CNT pitch). High transport performance requires the demonstration of small subthreshold swing, high transconductance, and high on-state conductance simultaneously. Our multichannel CNT FET exhibits smallest subthreshold swing, highest transconductance, and $2^{nd}$ highest on-state conductance, compared to other FETs with different inter-CNT pitches.
Figure 31:
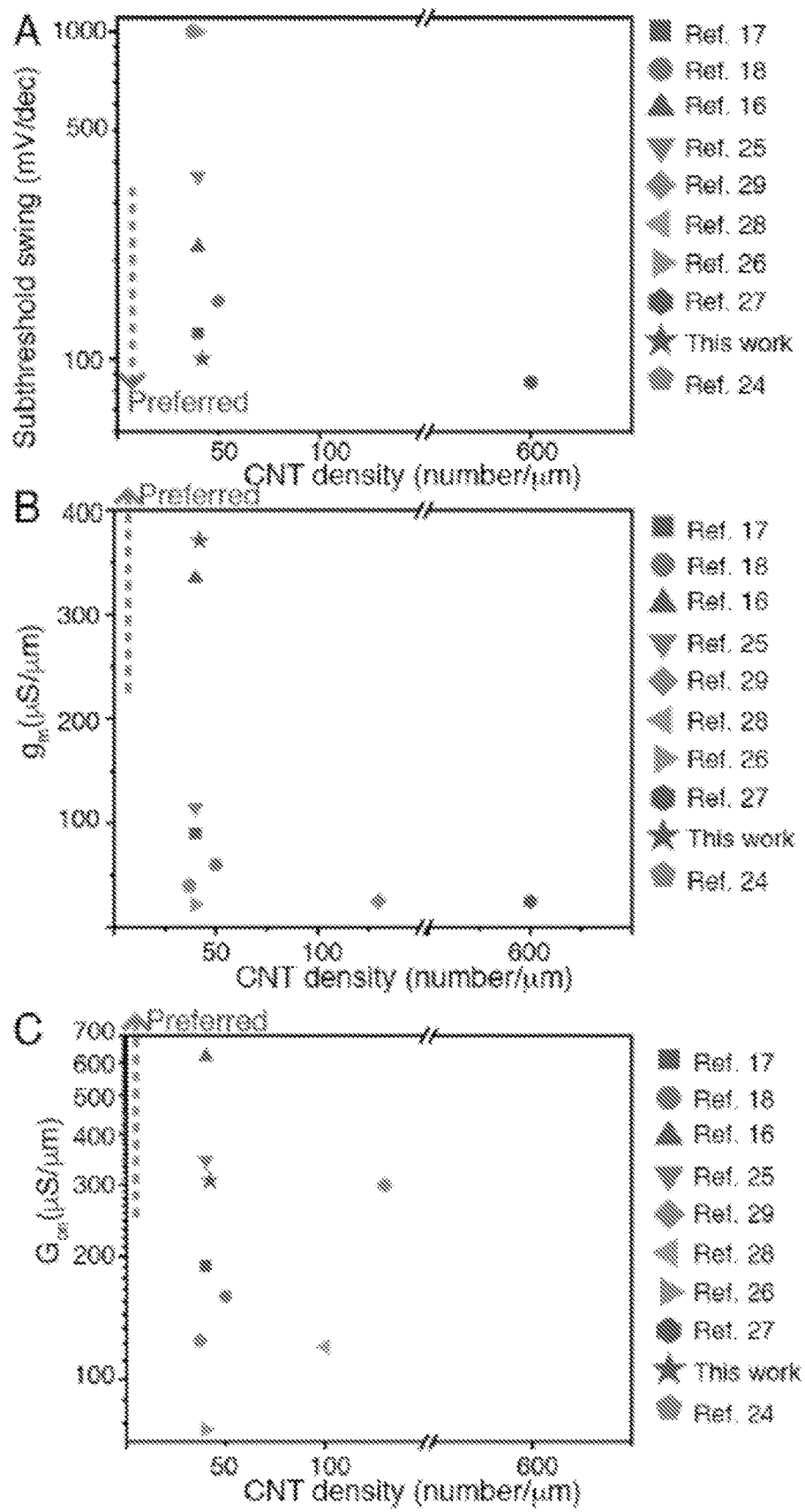
FIG. 31 shows benchmarking of CNT FETs with different CNT density. Benchmarking of our multichannel CNT FET with other reports on high density CNT arrays (uneven inter-CNT pitch) regarding: (A), subthreshold swing, (B), transconductance ($g_m$), and (C), on-state conductance (G.). Device performance from previous publications (References 16-18, 24-29) are obtained at Vds of −0.5 V. Specifically, the transport performance are obtained from FIG. 4D in (Reference 17), FIG. 1D in (Reference 18), FIG. 1F in (Reference 16), FIG. 2C in (Reference 25), FIG. 4A in (Reference 29), FIG. 11 in (Reference 28), FIG. 4B in (Reference 26), FIGS. 2B and 2D in (Reference 27), and FIG. 4C in (Reference 24). Channel lengths are ranging from 100 nm to 500 nm. In each panel, transport performance (i.e. subthreshold swing, on-state conductance, and transconductance) are plotted vs. structural parameter (CNT density). High transport performance requires the demonstration of small subthreshold swing, high transconductance, and high on-state conductance simultaneously. Our multichannel CNT FET exhibits $2^{nd}$ smallest subthreshold swing, highest transconductance, and $3^{rd}$ highest on-state conductance, compared to other FETs with different CNT density. Notably, FET with smallest subthreshold swing (Reference 27) exhibits an on-current density less than 5 uA/um, which does not meet the transport requirements of high-performance CNT FET.

At similar channel length and $V_{ds}$ (i.e. −0.5 V), we benchmarked current transport performance (i.e. $g_m$ and subthreshold swing) against conventional thin-film FETs using CVD-grown or polymer-wrapped CNTs (Reference 3, Reference 5, Reference 16—Reference 18, Reference 23—Reference 27) (FIG. 13E, FIGS. 30 and 31). Both high on-state performance ($g_m$ around 0.37 mS/µm) and fast on/off switching (subthreshold swing around 100 mV/decade) could be simultaneously achieved within the same solid-state DNA-templated FET; whereas thin-film CNT FETs with similar subthreshold swing (~100 mV/decade) exhibited more than 50% smaller $g_m$ (FIG. 30).

Figure 14:
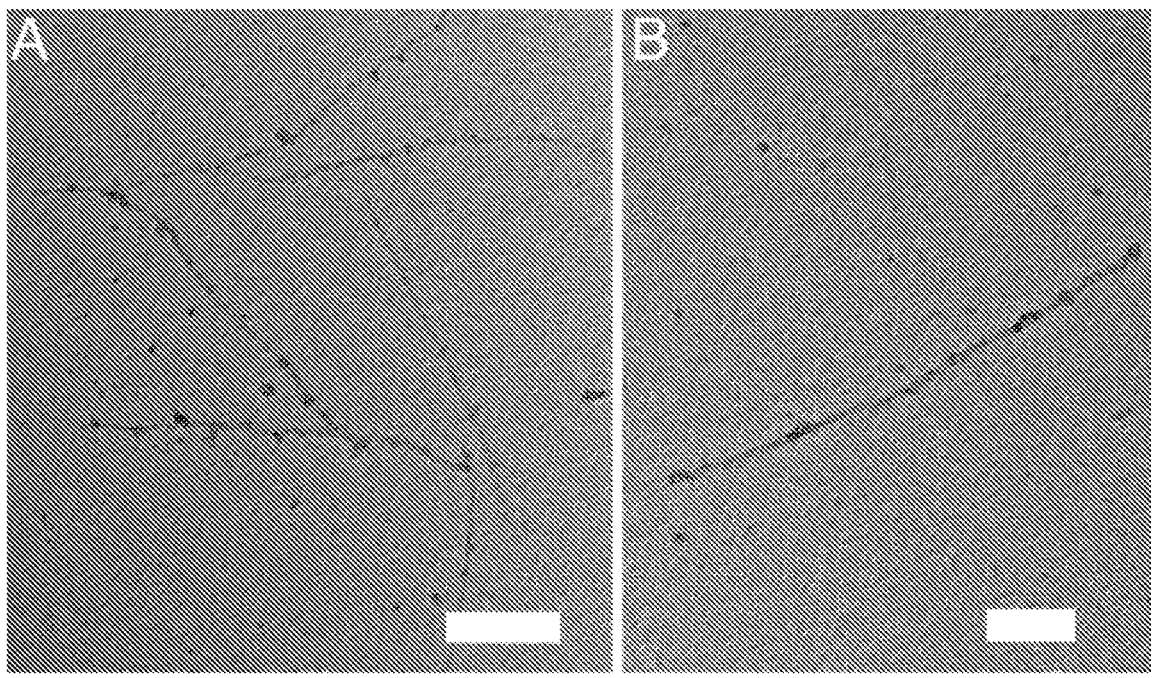
FIG. 14 shows zoomed-out (A) and zoomed-in (B) TEM images of the DNA-wrapped CNTs. The scale bar in A is 200 nm. The scale bar in B is 100 nm.
Figure 15:
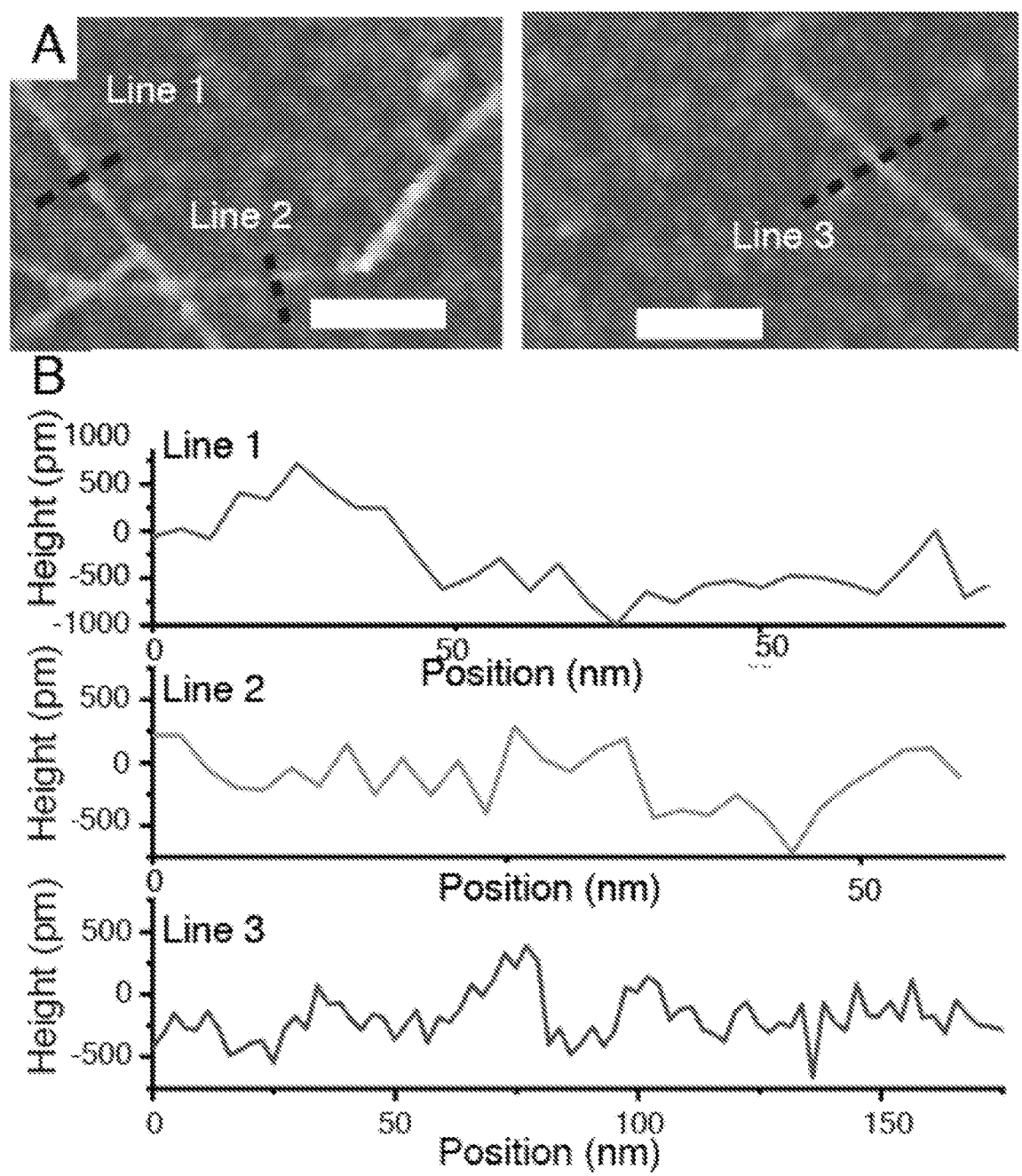
FIG. 15 shows height profile of CNTs. AFM images (A) and corresponding height profile (B) for three different CNTs. Dashed lines in (A) represent the positions for the height profiles in (B). The scale bar is 100 nm. As shown in the height profile, the CNT diameter distribution is ranging from less than 1 nm to –1.5 nm.

Furthermore, the subthreshold swing difference between the multichannel (average value of 103 mV/decade) and the single-channel CNT FETs (average value of 86 mV/decade in FIG. 22) was reduced to 17 mV/decade. Theoretical simulations suggest that, under identical gate constructs, uneven diameter of CNTs (Reference 6) and the alignment disorder (including crossing CNTs) (Reference 5) raise the subthreshold swing (Reference 4). We observed a wide diameter distribution of the DNA-wrapped CNTs in AFM images (FIG. 15) and TEM images (FIG. 14). Hence, the small subthreshold swing difference above indicated the effective gate modulation and evenly-spaced CNT alignment using SHINE (Reference 12), i.e. the absence of crossing/bundling CNTs within the channel area.

Statistics over all the operational multichannel DNA-free FETs exhibited $V_{th}$ of −0.32±0.27 V, on-current density of 25 to 154 µA/µm (at $V_{ds}$ of −0.5 V and $V_{gs}$ of −1.5 V), and subthreshold swing of 103±30 mV/decade. Different amounts of narrow CNTs (i.e. diameter<1 nm) within FETs led to the wide distribution of the on-current density. Because the Schottky barrier and the band gap increase with narrower CNT diameter, lower CNT conductance is often observed than those with diameter above 1.4 nm (Reference 30, Reference 31).

When comparing the transport performance differences between DNA-containing and DNA-free FETs (FIG. 29), we observed largely negatively shifted $V_{th}$ (−2V versus −0.32 V), higher $I_{ds}$ at positive $V_{gs}$ (mostly 10 to 200 nA/µm versus 0.1 to 10 nA/µm), and more than one order of magnitude smaller $g_m$ (4 to 50 µS/µm versus 70 to 370 µS/µm). Thus, high-concentration ssDNAs within multichannel FETs deteriorated the transport performance. Thermal annealing did not fully eliminate the impact because of the presence of insoluble annealing products, such as metal phosphates (Reference 22).

Figure 32:
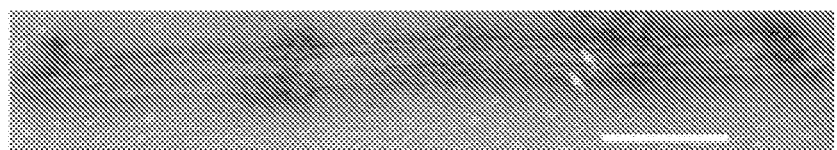
FIG. 32 shows zoomed-out TEM image for the assembled fixed-width CNT array with 16 nm inter-CNT pitch. Fixed-width DNA template exhibited a prescribed width around 34 nm. Arrows indicate the assembled CNTs on DNA templates. The scale bar is 100 nm.
Figure 33:
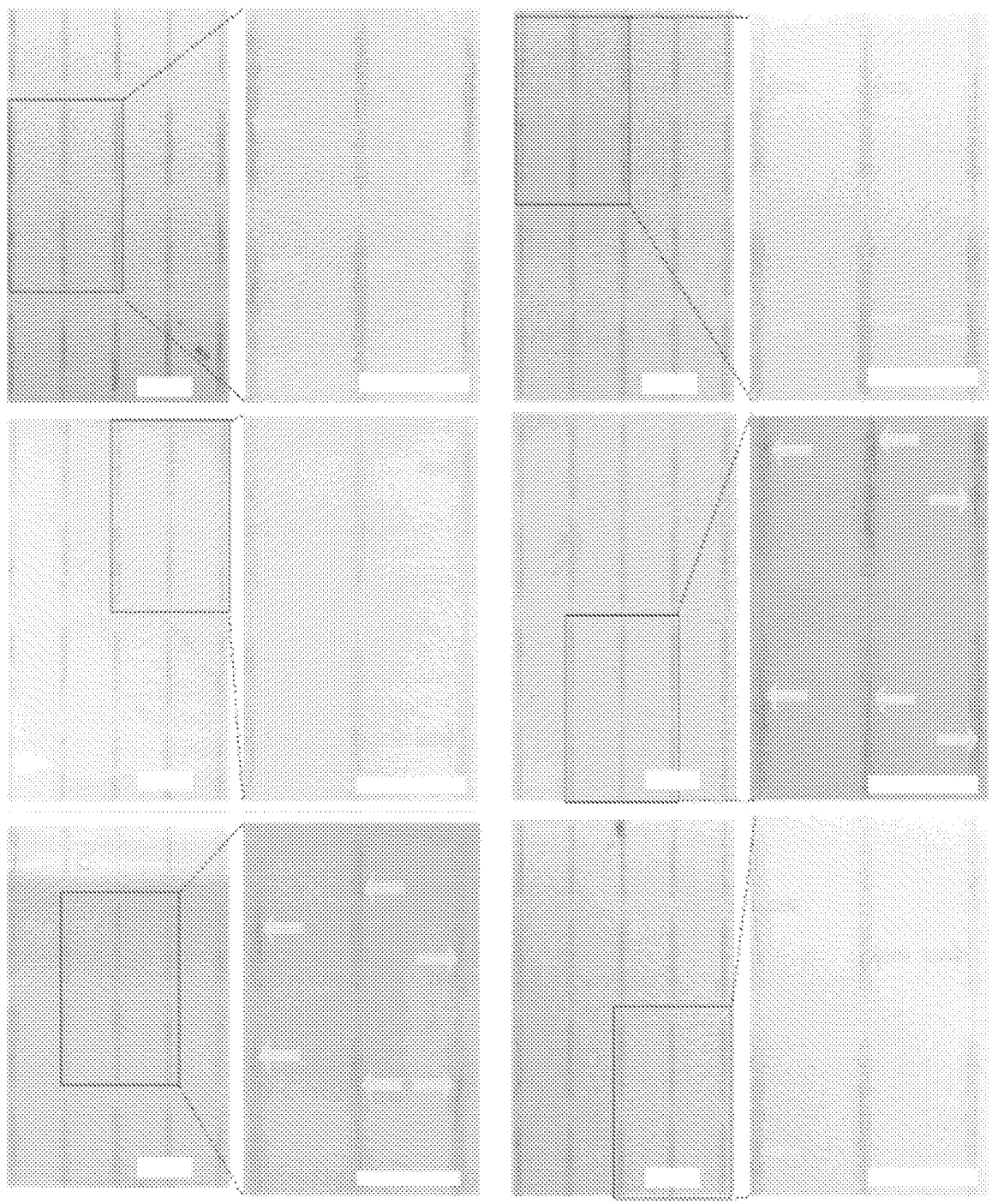
FIG. 33 shows SEM images for CNT-decorated DNA templates aligned on 120 cavities. The rectangular circles in the zoomed-out SEM images indicate the zoomed-in position. The arrows in the zoomed-in SEM images indicate the aligned DNA templates. The scale bars are 2 um.

When CNT-decorated DNA templates were deposited onto a flat Si wafer, random orientations of DNA templates were formed through unconfined surface rotation. We solved this issue by using 3D polymeric cavities to confine the surface orientation during large-area placement. We first assembled fixed-width CNT arrays (FIG. 32) with prescribed inter-CNT pitch of 16 nm (2 CNTs per array). Next, in a typical 500 µm by 500 µm write-field on the PMMA-coated Si substrate (more than 20 write-fields on 0.35 cm² substrate), we fabricated densely-aligned crenellated parapet-like PMMA cavities (cavity density ~2×10⁷ cavities/cm²). The minimum and the maximum designed widths along z direction were 180 and 250 nm, respectively.

After DNA deposition and PMMA liftoff (FIG. 10), >85% of the initial cavities (~600 cavities were counted) were occupied by DNA templates (FIG. 10, FIG. 22). The measured angular distribution, defined as the difference between the longitudinal axis of the DNA templates and the x direction of the substrate, was 56% within ±1° and 90% within ±7° (FIG. 10), per scanning electron microscopy (SEM)-based counting of all of the remaining DNA templates within the 600 cavity sites. This value included improvable impacts from the fabrication defects of PMMA cavities sites, the variation during DNA placement, and any disturbance from PMMA liftoff. Notably, the angular distribution was still improved compared to previous large-scale placement of DNA-templated materials (Reference 19). CNTs were not visible under SEM, because they were embedded within the DNA trenches and shielded from the SEM detector by DNA helices.

Figure 34:
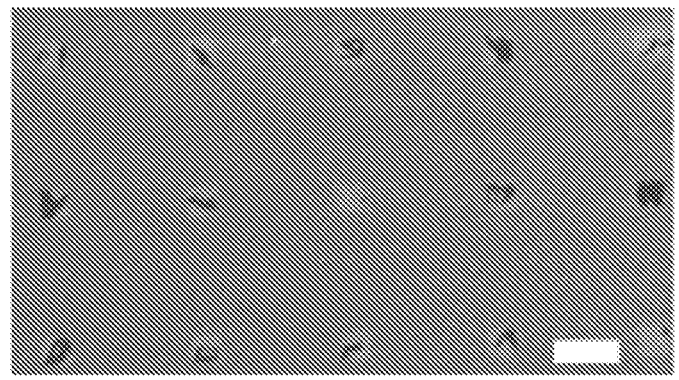
FIG. 34 shows SEM image for DNA templates placed within the rectangular PMMA cavity sites. The width of the PMMA cavities was designed as 2 um at a length-to-width aspect ratio of 1. The scale bar is 4 um.

Both the lengths of the DNA templates and the aspect ratio of the PMMA cavities affected the angular distribution. Longer DNA templates (length>1 µm) exhibited narrower angular distribution (0°±3.4° in FIG. 10) than those of shorter DNA templates (length<500 nm, 1°±11° in FIG. 10). In addition, PMMA cavities with higher length-to-width aspect ratio (i.e. 10 in FIG. 10) provided better orientation controllability than those with lower aspect ratio (i.e. 1 in FIG. 34). Hence, to further improve the angular distribution, longer DNA templates, as well as higher length-to-width aspect ratio of PMMA cavities, were beneficial. Because PMMA cavities were wider than the DNA templates, we observed up to 3 DNA templates, as well as the offset of DNA templates along the x and z directions, within a few PMMA cavities. Notably, DNA templates did not fully cover the PMMA cavities, even for a saturated DNA solution.

Figure 35:
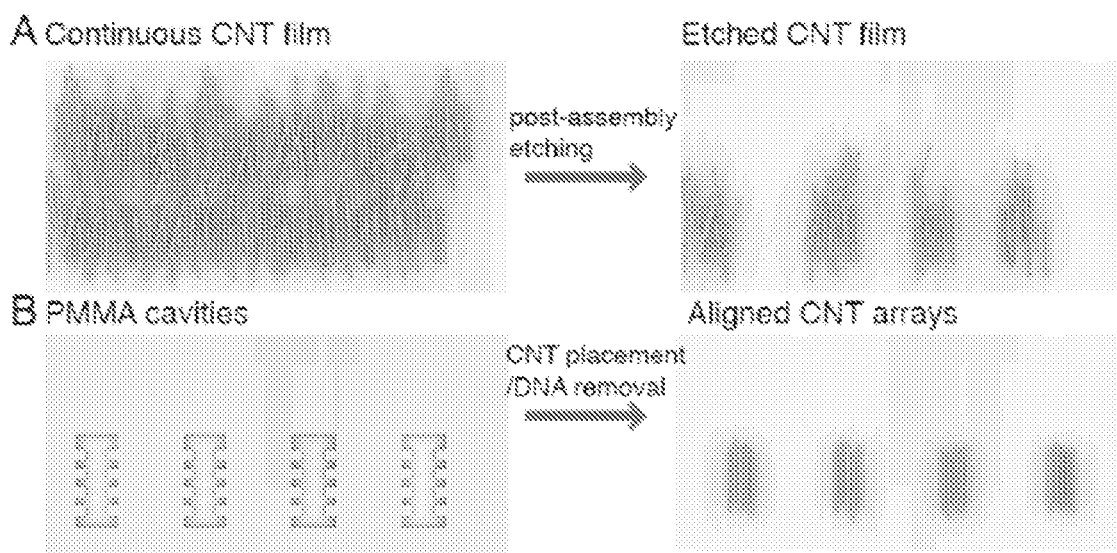
FIG. 35 shows different approaches for preparing CNT arrays with designer array width, inter-array spacing and CNT counts over centimeter-scale. (A) continuous CNT film (with random orientations) is processed with a post-assembly etching step to produce designer array width/inter-array spacing/CNT counts. (B) placing fixed-width CNT arrays (assembled using 3D DNA nanotrenches) within the prefabricated PMMA cavities, followed by PMMA liftoff and DNA removal, could directly produce designer array geometries without a post-assembly etching.

Two-dimensional hydrophilic surface patterns, with shape and dimensions identical to the DNA structures, could direct the orientation of the deposited DNA structures (Reference 32). However, it is difficult to design patterns adaptive to DNA templates with variable lengths. In contrast, effective spatial confinement relies mainly on the lengths of the DNA templates and the aspect ratio of PMMA cavities, and is applicable to irregular template lengths. Therefore, the anisotropic biotemplated CNT arrays could be aligned along the longitudinal direction of the cavities (FIG. 35).

To further promote the on-state performance, scaling the inter-CNT pitch into sub-10 nm may be beneficial. However, at 2 nm inter-CNT pitch, the enhanced electrostatic interactions may impact the on/off switching. Therefore, the correlation between the inter-CNT pitch and performance metrics of CNT FETs needs to be verified. Combined with large-area fabrications via conventional lithography and directed assembly of block copolymers, biomolecular assembly could provide a high-resolution paradigm for programmable electronics over large area. The hybrid electronic-biological devices may also integrate electrical stimuli and biological input/outputs, producing ultra-scaled sensors or bio-actuators.

Materials and Experimental Methods for Example 2

1. Atomic Force Microscopy (AFM)

7 uL as-prepared CNT-decorated DNA templates solution was deposited onto a 1-cm² sized silicon chip followed by stepwise rinsing in 50%, 95%, and 99.5% ethanol. The sample was imaged on a Multimode SPM (Vecco) via tapping mode.

2. Scanning Electron Microscopy (SEM)

7 uL as-prepared CNT-decorated DNA templates solution was deposited onto a 1-cm² sized silicon chip followed by stepwise rinsing in 50%, 95%, and 99.5% ethanol. The dried silicon chip was imaged on a HITACHI S-4800 system operated at 5 kV under high vacuum.

3. Transmission Electron Microscopy (TEM)

0.6 uL as-prepared (without purification) CNT-decorated DNA templates was diluted into 5 uL water and adsorbed onto glow discharged carbon-coated TEM grids for 4 min. Then the remaining solution was wiped away, followed by negative staining using 6 uL 2% aqueous uranyl formate solution (7 sec) and a quick water rinsing. Imaging was performed using an JEOL 2100 operated at 120 kV.

4. Centimeter-Scale Oriented Placement

A 0.35-cm$^2$ sized silicon substrate was firstly spin-coated with poly(methyl methacrylate) (PMMA) resist (Allresist AR-P 672.045) and patterned using electron-beam lithography (Raith Voyager, with an exposure dose of 325 uC/cm$^2$ at 0.9 nA current). The patterned PMMA layer was developed in a 1:3 mixture of methylisobutyl ketone (MIBK) and isopropyl alcohol (IPA), followed by rinsing with IPA and drying with nitrogen. The solution of CNT-decorated DNA templates was dipped onto the lithography-defined patterns. Then the silicon substrate was kept in a sealed chamber for 2 hours. During this process, the DNA templates diffused into the PMMA cavities. Si substrate was then dried, followed by PMMA liftoff, leaving only the aligned DNA templates on the flat Si substrate. Finally, we imaged the sample with SEM.

5. Removing DNA Templates

We applied the following process to remove the assembled DNA templates while retaining CNT alignment: (1) fabricating alignment markers on Si wafer with electron-beam lithography; (2) depositing the CNT-decorated DNA templates onto Si wafer and registering the positions with low-magnification SEM; (3) fabricating metal bars to fix the assembled CNT arrays onto Si wafer; and (4) removing DNA templates by continuously water and $H_2O_2$ rinsing. We used the length-sorted CNTs (semiconducting purity>95%) from NIST, and the length range was 300-1000 nm.

Alignment Marker:

A 230-nm thick PMMA layer was spun onto Si wafer (with 300-nm thick $SiO_2$ on top) and the fine alignment marker pattern was written using Raith Voyager system (at a current of 9 nA and a dose of 780 uC/cm$^2$). The alignment marker pattern was developed in a 1:3 mixture of MIBK and IPA. A stacking titanium/gold film (5-nm thick titanium and 45-nm thick gold) was deposited using DE400 e-beam evaporation system. Liftoff was performed at room temperature in acetone without sonication, followed by an ethanol rinsing. The sample was dried with nitrogen.

CNT Deposition and Registration:

A 9 uL solution of the assembled CNT-decorated DNA templates was dipped onto the oxygen plasma-cleaned marked Si wafer, followed by the incubation at room temperature for 1 hour. After that, the remaining solution was blown away with nitrogen. The Si wafer was sequentially rinsed with 75%, 95%, and 99% ethanol, followed by air drying. The Si wafer was then imaged under SEM at low magnification (operated at 1 kV). The positions of the CNT-decorated DNA templates were registered relative to the alignment markers.

CNT Fixing and DNA Removal:

A 230-nm thick PMMA layer was spun onto the CNT-deposited Si wafer. The metal bar pattern was written using Raith Voyager system (at a current of 400 pA and a dose of 750 uC/cm$^2$). The metal bar pattern was developed in a 1:3 mixture of MIBK and IPA. A stacking film of 5-nm thick titanium and 60-nm thick gold was deposited using DE400 e-beam evaporation system. Liftoff was performed at room temperature in acetone without sonication, followed by an ethanol rinse. The sample was dried with nitrogen. DNA removal was then performed by sequential water and $H_2O_2$ (5%) rinsing.

6. FET Construction

For FET construction, we used electron beam lithography for fabricating the source/drain/gate electrodes onto the assembled CNT arrays and constructing the electrical contact pads.

Source/Drain Electrodes:

A 230-nm thick PMMA layer was spun onto the cleaned CNT arrays, followed by writing the source and the drain electrodes patterns with Raith Voyager system (at a current of 400 pA and a dose of 750 uC/cm$^2$). The source and the drain electrodes patterns were developed in a 1:3 mixture of MIBK and IPA. A stacking film of 0.5-nm thick titanium, 30-nm thick palladium, and 40-nm thick gold was deposited using DE400 e-beam evaporation system. Liftoff was performed at room temperature in acetone without sonication, followed by an ethanol rinsing. The sample was dried with nitrogen.

Gate Electrode:

Next, a layer of 230-nm thick PMMA layer was spun onto the Si wafer, followed by writing the channel patterns with Raith Voyager system (at a current of 400 pA and a dose of 750 uC/cm$^2$). One-nm thick yttrium metal film was first deposited using DE400 e-beam evaporation system. Liftoff was performed at 70° C. in acetone. Then, the yttrium film was oxidized in the air at 250° C.

A 230-nm thick PMMA layer was then spun onto the $Y_2O_3$-coated Si wafer, followed by writing the gate electrode pattern with Raith Voyager system (at a current of 400 pA and a dose of 750 uC/cm$^2$). The gate electrode pattern was developed in a 1:3 mixture of MIBK and IPA. Eight-nm thick $HfO_2$ was next deposited via atomic layer deposition (Beneq) at 90° C. A 15-nm thick palladium film was finally deposited using DE400 e-beam evaporation system. Liftoff was performed at room temperature in acetone without sonication, followed by ethanol rinsing. The sample was dried with nitrogen.

Contact Pads:

For fabricating large electrical contact pads connecting to the electrodes, a 230-nm thick PMMA layer was first spun onto the sample. Contact pad pattern was exposed using Raith Voyager system (at a current of 9 nA and a dose of 750 uC/cm$^2$). The contact pad pattern was developed in a 1:3 mixture of MIBK and IPA, then dried with nitrogen. A stacking film of 5-nm thick titanium and 70-nm thick gold was deposited using DE400 e-beam evaporation system. Liftoff was performed at room temperature in acetone without sonication, followed by ethanol rinsing. And the sample was dried with nitrogen.

Electrical Measurements for CNT FETs:

The electrical measurements for the constructed CNT FETs were performed at room temperature in a probe station connected to a Keithley 4200 SCS Semiconductor Device Analyzer.

7. Introducing ssDNAs at Channel Interface

After fabricating the source/drain electrodes, we applied the following process to introduce ssDNAs at channel interface and construct the gate dielectric accordingly: (1) a 230-nm thick PMMA layer was spun onto the wafer, followed by writing the gate electrode pattern with Raith Voyager system (at a current of 400 pA and a dose of 750 uC/cm$^2$). The gate electrode pattern was developed in a 1:3 mixture of MIBK and IPA; (2) 10 uL solution of L1 (1 uM) was dipped onto the fixed CNT arrays, and incubated at room temperature for 1.5 h; (3) the remaining solution was blown away with nitrogen, followed by sequentially rinsing with 75%, 95%, and 99% ethanol; (4) 9-nm thick $HfO_2$ medium was grown within the developed pattern via atomic layer deposition (Savannah) at 90° C. A 15-nm thick palladium film was deposited using DE400 e-beam evaporation system. Liftoff was performed at room temperature in acetone without sonication, followed by ethanol rinsing. The sample was dried with nitrogen.

After that, the contact pads and the electrical measurements were performed using identical approaches above in Section "FET construction".

Further Optimizations of FET Performance for Example 2

To further improve the FET performance, it is necessary to increase the on-state conductance while lower the subthreshold swing.

Towards higher on-state conductance, several strategies have been suggested in previous reports. For example, when applying the gate overdrive ($V_{gs}-V_{th}$) up to 6 V, on-current density around 0.5 mA/um has been reported (at 100 nm $L_{ch}$) (Reference 5). However, at ultra-scaled technology nodes, the supply voltage ($V_{dd}$) is typically below 1 V, which limits the available voltage range of $V_{gs}$. Meanwhile, raising CNT density to 500 CNTs/um, as well as scaling the channel length to 10 nm, could also provide oncurrent density of 0.8 mA/um (at gate overdrive around 3 V) (Reference 6). But high CNT density also presents challenges in promoting the conductance per CNT, because of the strong inter-CNT screening effect at high CNT density. As a result, the on-state conductance per CNT is lowered to less than 2 uA/CNT, around 10% of the single-channel CNT FET at identical channel length (Reference 33). Besides, subthreshold swing around 500 mV/decade is produced due to the destructive crossing CNTs and diameter distribution at high CNT density. Using 3D DNA nanotrenches, the formation of crossing CNTs could be minimized. Hence, by exploring the correlation between inter-CNT pitch and the on-state conductance, the optimized inter-CNT pitch could balance the competing needs on higher CNT density and lower inter-CNT interactions. Together with the short channel design, the on-state conductance of multichannel CNT FETs will be maximized.

Decreasing the subthreshold swing to 60-80 mV/decade is recommended by the International Technology Roadmap for Semiconductors (Reference 1). Notably, decreasing the subthreshold swing should not degrade the on-state conductance. In the CNT FETs constructed from thin-film CNT arrays, subthreshold swing of 60 mV/decade has been reported (Reference 34). However, the on-current density is as small as 100 nA/um, and does not meet the requirements of high-performance electronics. Based on our demonstration, the subthreshold swing of the multichannel CNT FETs is slightly higher than that of single-channel CNT FETs. Because of the absence of crossing CNTs, the small difference value (17 mV/decade) is ascribed to the diameter distribution. Hence, when CNTs with uniform diameter are available, 3D DNA nanotrenches could in principle build multichannel CNT FETs with subthreshold swing identical to the single-channel CNT FETs. Further decreasing the subthreshold swing to the thermionic limit of 60 mV/decade or even smaller relies on the gate efficiency. For instance, using a graphene-contacted design, single-channel CNT FETs have been demonstrated with both subthreshold swing of sub-60 mV/decade and on-state current of 8 uA/CNT (Reference 35). Integrating the graphene-contacted design within multichannel CNT FETs may promote the on/off switching than current metal contacts.

Higher CNT purity is also necessary for improving the successful rate of FET construction. For the projected CNT FET architecture, 95% semiconducting CNT purity produces 73% successful rate in the six-channel CNT FETs, and 54% successful rate in the twelve-channel FETs. Considering high-performance micro-processors contain up to 1 billion FETs, a semiconducting CNT purity higher than 99.99999998% is necessary to ensure all the FETs are operational.

Fabricating CNT Arrays with Designer Width and Inter-Array Spacings for Example 2

In digital circuits, it is quite common to have larger spacing values outside individual FETs than the semiconductor channel pitch. In Si circuits, for example, Samsung's 14 nm technology node has a uniform fin pitch of 49 nm (FET width is less than 250 nm); whereas the spacing between two nearest fins in neighboring FETs can be as large as 700 nm, 13 times larger than the fin pitch. Similar spacing differences have also been observed in Intel's 22 nm, 14 nm, and 10 nm Si technology nodes. The larger spacing between two nearest FETs may accommodate the interconnect metal wires. And the larger inter-FET spacing is adjustable tailored to different circuit architectures.

Existing thin-film approaches employ a post-assembly etching approach to prepare arrays with designer width, inter-array spacings, and CNT counts over centimeter-scale. Continuous CNT film first covers the entire surface of the substrate. Then a post assembly etching (via oxygen plasma) is introduced to etch away CNTs out of the channel area (FIG. 35A). Hence, both array width and inter-array spacing could be fabricated tailored to FET/circuit layouts. Importantly, inter-array spacing is necessary to prevent stray conducting pathways (Reference 37) and accommodate metal contacts. It has been reported that the presence of CNTs beneath the contacts lowers the adhesion of metal contacts to the substrate surface (Reference 6). After the post-assembly etching, full surface coverage CNT films are etched into several individual arrays with width around 50 nm to a few hundred nanometers, tailored to FET layouts.

In comparison, we demonstrate a different strategy to achieve the designer width, inter-array spacings, and CNT counts in the manuscript (FIG. 35B). Using 3D DNA nanotrenches, CNT arrays are assembled with designer inter-CNT pitches and CNT counts on fixed-width 3D DNA templates. And the CNT counts per array could be programmed by different template widths. The assembled CNT arrays are then placed within the pre-fabricated PMMA cavities, followed by PMMA liftoff and DNA removal. Without post-assembly etching, prescribed inter-array spacing is demonstrated after the centimeter-scale oriented placement. Because the inter-array spacing is defined by lithography of PMMA cavities, in principle, it could be further scaled to sub-200 nm. Therefore, the maximum array density is around 105/ cm, close to that of Si fins at 10-nm technology node (less than $3*10^5$/cm). The array width and inter-array spacing from our approach are also similar to those fabricated from the post-assembly etching approach.

References for Example 2

1. *The International Technology Roadmap for Semiconductors:* 2013.
2. G. Hills et al., Understanding energy efficiency benefits of carbon nanotube field-effect transistors for digital VLSI, *IEEE Trans. Nanotech.* 17, 1259-1269 (2018).
3. Q. Cao et al., Arrays of single-walled carbon nanotubes with full surface overage for high-performance electronics, *Nature Nanotech.* 8, 180-186 (2013).
4. G. J. Brady, K. R. Jinkins, M. S. Arnold, Channel length scaling behavior in transistors based on individual versus dense arrays of carbon nanotubes, *J. Appl. Phys.* 122, 124506 (2017).

5. G. J. Brady et al., Quasi-ballistic carbon nanotube array transistors with current density exceeding Si and GaAs, *Sci. Adv.* 2, e1601240 (2016).
6. Q. Cao, J. Tersoff, D. B. Farmer, Y. Zhu, S.-J. Han, Carbon nanotube transistors scaled to a 40-nanometer footprint, *Science* 356, 1369-1372 (2017).
7. H. A. Becerril, A. T. Woolley, DNA-templated nanofabrication, *Chem. Soc. Rev.* 38, 329-337 (2009).
8. M. R. Jones, N. C. Seeman, C. A. Mirkin, Programmable materials and the nature of the DNA bond, *Science* 347, 1260901 (2015).
9. S.-P. Han, H. T. Maune, R. D. Barish, M. Bockrath, W. A. Goddard, III, DNA-linker-induced surface assembly of ultra dense parallel single walled carbon nanotube arrays, *Nano Lett.* 12, 1129-1135 (2012).
10. A. Mangalum, M. Rahman, M. L. Norton, Site-specific immobilization of single-walled carbon nanotubes onto single and one-dimensional DNA origami, *J. Am. Chem. Soc.* 135, 2451-2454 (2013).
11. H. Pei et al., Organizing end-site-specific SWCNTs in specific loci using DNA, *J. Am. Chem. Soc.* 141, 11923-11928 (2019).
12. W. Sun et al., Precise pitch-scaling of carbon nanotube arrays within three-dimensional DNA nanotrenches, *Science* (2020).
13. H. T. Maune et al., Self-assembly of carbon nanotubes into two-dimensional geometries using DNA origami templates, *Nature Nanotech.* 5, 61-66 (2010).
14. K. Keren, R. S. Berman, E. Buchstab, U. Sivan, E. Braun, DNA-templated carbon nanotube field-effect transistor, *Science* 302, 1380-1382 (2003).
15. S.-J. Han et al., High-speed logic integrated circuits with solution-processed self-assembled carbon nanotubes, *Nature Nanotech.* 12, 861-865 (2017).
16. D. Zhong et al., Gigahertz integrated circuits based on carbon nanotube films, *Nature Electron.* 1, 40-45 (2018).
17. C. Zhao et al., Exploring the performance limit of carbon nanotube network film field-effect transistors for digital integrated circuit applications, *Adv. Funct. Mater.* 29, 1808574 (2019).
18. L. Liu et al., Carbon nanotube complementary gigahertz integrated circuits and their applications on wireless sensor interface systems, *ACS Nano* 13, 2526-2535 (2019).
19. A. M. Hung et al., Large-area spatially ordered arrays of gold nanoparticles directed by lithographically confined DNA origami, *Nature Nanotech.* 5, 121-126 (2010).
20. N. Nakatsuka et al., Aptamer-field-effect transistors overcome Debye length limitations for small-molecule sensing, *Science* 362, 319-324 (2018).
22. F. Zhou et al., Programmably shaped carbon nanostructure from shape-conserving carbonization of DNA, *ACS Nano* 10, 3069-3077 (2016).
23. Q. Cao, S.-J. Han, G. S. Tulevski, Fringing-field dielectrophoretic assembly of ultrahigh-density semiconducting nanotube arrays with a self-limited pitch, *Nature Commun.* 5, 5071 (2014).
24. J. Wu et al., Self-assembly of semiconducting single-walled carbon nanotubes into dense, aligned rafts, *Small* 9, 4142-4148 (2013).
25. Y. Cao et al., Radio frequency transistors using aligned semiconducting carbon nanotubes with current-gain cut-off frequency and maximum oscillation frequency simultaneously greater than 70 GHz, *ACS Nano* 10, 6782-6790 (2016).
26. J. Wu, A. Antaris, M. Gong, H. Dai, Top-down patterning and self-assembly for regular arrays of semiconducting single-walled carbon nanotubes, *Adv. Mater.* 26, 6151-6156 (2014).
27. D. Lee et al., Three-dimensional fin-structured semiconducting carbon nanotube network transistor, *ACS Nano* 10, 10894-10900 (2016).
28. M. M. Shulaker et al., High-performance carbon nanotube field-effect transistors, *IEEE Int. Electron Devices Meeting in San Francisco CA* 33.6.1-33.6.4 (2014).
29. Y. Hu et al., Growth of high-density horizontally aligned SWNT arrays using Trojan catalysts, *Nature Commun.* 6, 6099 (2015).
30. L. Zhang et al., Assessment of chemically separated carbon nanotubes for nanoelectronics, *J. Am. Chem. Soc.* 130, 2686-2691 (2008).
31. L. Zhang et al., Optical characterizations and electronic devices of nearly pure (10,5) single-walled carbon nanotubes, *J. Am. Chem. Soc.* 131, 2454-2455 (2009).
32. A. Gopinath, P. W. K. Rothemund, Optimized assembly and covalent coupling of single-molecule DNA origami nanoarrays, *ACS Nano* 8, 12030-12040 (2014).
33. C. Qiu et al., Scaling carbon nanotube complementary transistors to 5-nm gate lengths, *Science* 355, 271-276 (2017).
34. L. Xiang et al., Low-power carbon nanotube-based integrated circuits that can be transferred to biological surfaces, *Nature Electron.* 1, 237-245 (2018).
35. C. Qiu et al., Dirac-source field-effect transistors as energy-efficient, high-performance electronic switches, *Science* 361, 387-392 (2018).
36. G. S. Tulevski et al., Toward high-performance digital logic technology with carbon nanotubes, *ACS Nano* 8, 8730-8745 (2014).
37. J. Zhang et al., Robust digital VLSI using carbon nanotubes, *IEEE Transactions on Computer-Aided Design of Integrated Circuits and Systems* 31, 453-471 (2012).

It should be noted that although several steps of the method for depositing nanostructures on substrates are described in the above description, this division is merely exemplary rather than mandatory. In fact, according to the embodiments of the present application, features and functions of two or more modules described above may be embodied in one module. Conversely, features and functions of one module described above can be further divided into a plurality of modules.

Those skilled in the art will be able to understand and implement other variations to the disclosed embodiments by studying the specification, the application, the drawings and the appended claims. In the claims, the words "include" or "including" do not exclude other elements and steps, and the words "a" or "an" do not exclude the plural. In the practical application of the present application, one part may perform the functions of a plurality of technical features cited in the claims. Any reference numerals in the claims should not be construed as limiting the scope.

What is claimed is:

1. A method for depositing nanostructures on a substrate, comprising:
    forming a patterned alignment layer on a surface of the substrate, wherein the patterned alignment layer has one or more cavities each having a main region for accommodating at least one template nanostructure therein and a plurality of extension regions extending from the main region and in fluid communication with the main region, and wherein the plurality of extension regions are sized and shaped to not accommodate the at least one template nanostructure; and diffusing template nanostructures into the one or more cavities of the patterned alignment layer.

2. The method of claim 1, further comprising:
removing the patterned alignment layer from the substrate.

3. The method of claim 2, wherein removing the patterned alignment layer from the substrate comprises:
removing the patterned alignment layer from the substrate using a liftoff process.

4. The method of claim 1, wherein the main region of each of the one or more cavities is further configured to orientate the at least one template nanostructure accommodated therein.

5. The method of claim 1, wherein each of the one or more cavities is further configured that, when the at least one template nanostructure is accommodated in the cavity, at least one translational degree of freedom of the at least one template nanostructure along the surface of the substrate is limited.

6. The method of claim 1, wherein forming a patterned alignment layer on a surface of the substrate comprises:
forming an alignment layer on the surface of the substrate; and
patterning the alignment layer.

7. The method of claim 6, wherein patterning the alignment layer comprises:
patterning the alignment layer using a lithography process.

8. The method of claim 7, wherein the lithography process comprises: electro-beam lithography, photolithography, imprint lithography or directed self-assembly of block copolymers.

9. The method of claim 7, wherein forming an alignment layer on the surface of the substrate comprises:
spin-coating the surface of the substrate with a photoresist to form the alignment layer.

10. The method of claim 9, wherein the photoresist comprises poly (methyl methacrylate) (PMMA) or polydimethylsiloxane (PDMS).

11. The method of claim 1, wherein diffusing template nanostructures into the one or more cavities of the patterned alignment layer comprises:
dipping a solution containing the template nanostructures onto the patterned alignment layer; and
incubating the substrate to diffuse the template nanostructures into the cavities.

12. The method of claim 11, wherein incubating the substrate comprises:
dehydrating or evaporating the substrate in a sealed chamber for a predetermined time period.

13. The method of claim 1, wherein before diffusing template nanostructures into the one or more cavities of the patterned alignment layer, the method further comprises:
differentiating the substrate to improve adhesivity of the surface of the substrate to the template nanostructures.

14. The method of claim 2, wherein the template nanostructures are decorated with functional nanostructures, and wherein, after removing the patterned alignment layer from the substrate, the method further comprises:
removing template portion of the template nanostructures from the substrate to leave the functional nanostructures on the substrate.

15. The method of claim 14, wherein before removing template portion of the template nanostructures from the substrate, the method further comprises:
forming fixation structures on the substrate to fix the functional nanostructures on the substrate.

16. The method of claim 1, wherein one of the one or more cavities has a plurality of extension regions which increase a volume of the cavity by at least 5%, or preferably by 10%, 20%, 30%, 50%, 100%, 150%, 200% or higher.

17. The method of claim 1, wherein each of the one or more cavities has a depth of 2 or more folds, preferably 5 or more folds, than a thickness of the template nanostructures.

18. The method of claim 1, wherein the template nanostructures comprise one or more substances selected from the group consisting of nucleic acid templates, decorated nucleic acid templates, protein templates, peptide nucleic acid templates, polymer templates, carbon nanotubes (CNTs), polymer-wrapped CNTs, CNT films, semiconductor nanoparticles, semiconductor nanowires, semiconductor nano-bricks, metal nanoparticles, metal nanowires, metal nano-bricks, polymeric nanoparticles, polymeric nanowires, polymeric nano-bricks, ceramic nanoparticles, ceramic nanowires, ceramic nano-bricks, metal oxide nanoparticles, metal oxide nanowires, metal oxide nano-bricks, fluoride nanoparticles, fluoride nanowires and fluoride nano-bricks.

19. The method of claim 1, wherein the template nanostructures are decorated with functional nanostructures.

20. The method of claim 19, wherein the functional nanostructures comprise one or more substances selected from the group consisting of carbon nanotubes (CNTs), polymer-wrapped CNTs, CNT films, semiconductor nanoparticles, semiconductor nanowires, semiconductor nano-bricks, metal nanoparticles, metal nanowires, metal nano-bricks, polymeric nanoparticles, polymeric nanowires, polymeric nano-bricks, ceramic nanoparticles, ceramic nanowires, ceramic nano-bricks, metal oxide nanoparticles, metal oxide nanowires, metal oxide nano-bricks, fluoride nanoparticles, fluoride nanowires and fluoride nano-bricks.

21. A nanostructure array comprising at least one template nanostructure on a substrate deposited by the method of claim 1.

22. A nanostructure array comprising at least one functional nanostructure on a substrate deposited by the method of claim 14.

* * * * *